US011983045B2

(12) United States Patent
Lin et al.

(10) Patent No.: US 11,983,045 B2
(45) Date of Patent: May 14, 2024

(54) ELECTRONIC DEVICE

(71) Applicant: COMPAL ELECTRONICS, INC., Taipei (TW)

(72) Inventors: Che-Hsien Lin, Taipei (TW); Che-Hsien Chu, Taipei (TW); Ko-Yen Lu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 200 days.

(21) Appl. No.: 17/086,459

(22) Filed: Nov. 2, 2020

(65) Prior Publication Data

US 2021/0191476 A1 Jun. 24, 2021

Related U.S. Application Data

(60) Provisional application No. 62/953,901, filed on Dec. 26, 2019, provisional application No. 62/953,156, filed on Dec. 23, 2019.

(51) Int. Cl.
*G06F 1/16* (2006.01)
*H05K 5/02* (2006.01)
*H05K 5/03* (2006.01)

(52) U.S. Cl.
CPC .......... *G06F 1/1681* (2013.01); *G06F 1/1618* (2013.01); *H05K 5/0226* (2013.01); *H05K 5/03* (2013.01)

(58) Field of Classification Search
None
See application file for complete search history.

(56) References Cited

U.S. PATENT DOCUMENTS

| 9,450,038 | B2* | 9/2016 | Kwon | H01L 29/66757 |
| 10,007,369 | B1* | 6/2018 | Noh | G06F 3/044 |
| 2011/0050657 | A1* | 3/2011 | Yamada | H10K 59/18 |
| | | | | 361/679.01 |
| 2012/0314383 | A1* | 12/2012 | Oohira | G02F 1/13452 |
| | | | | 361/749 |

(Continued)

FOREIGN PATENT DOCUMENTS

| CN | 204437047 | 7/2015 |
| CN | 109654113 | 4/2019 |
| EP | 2275898 | 1/2011 |

OTHER PUBLICATIONS

"Office Action of China Counterpart Application", dated Oct. 29, 2021, p. 1-p. 8.

(Continued)

*Primary Examiner* — Anthony Q Edwards
*Assistant Examiner* — Rashen E Morrison
(74) *Attorney, Agent, or Firm* — JCIPRNET

(57) ABSTRACT

An electronic device includes two bodies, at least one hinge structure, a functional assembly, and at least one linkage structure. The two bodies are pivotally connected to each other through the hinge structure. The functional assembly is movably disposed on one of the two bodies. The linkage structure is connected between the two bodies, and the functional assembly is connected to the linkage structure. The linkage structure is adapted to drive the functional assembly to move relative to the corresponding body as the two bodies are rotated relative to each other.

15 Claims, 25 Drawing Sheets

(56) References Cited

U.S. PATENT DOCUMENTS

| | | | | |
|---|---|---|---|---|
| 2014/0132488 A1* | 5/2014 | Kim | ...................... | G06F 1/1637 |
| | | | | 345/76 |
| 2015/0010742 A1* | 1/2015 | Han | ...................... | B32B 27/302 |
| | | | | 428/335 |
| 2018/0066465 A1* | 3/2018 | Tazbaz | ................ | E05D 11/1007 |
| 2020/0136069 A1* | 4/2020 | Paek | ......................... | B32B 3/08 |
| 2020/0257335 A1* | 8/2020 | Kim | ...................... | G06F 1/1641 |
| 2021/0018960 A1* | 1/2021 | Kato | ..................... | G06F 1/1681 |

OTHER PUBLICATIONS

Office Action of Taiwan Counterpart Application, dated Feb. 23, 2021, pp. 1-4.

\* cited by examiner

ELECTRONIC DEVICE

CROSS-REFERENCE TO RELATED APPLICATION

This application claims the priority benefits of U.S. provisional application Ser. No. 62/953,156, filed on Dec. 23, 2019 and U.S. provisional application Ser. No. 62/953,901, filed on Dec. 26, 2019. The entirety of the above-mentioned patent application is hereby incorporated by reference herein and made a part of this specification.

BACKGROUND

Technical Field

The disclosure relates to an electronic device, and more particularly to an electronic device with bodies pivotally rotated relative to each other.

Description of Related Art

With the popularization and the development of notebook computers, consumers have increasing demand for convenience and a variety of functions. In some notebook computers, two bodies are provided with display panels in the form of dual screens. The two bodies can be rotated 180 degrees relative to each other to be flattened, and the two bodies can be rotated 360 degrees relative to each other to be a tablet operation mode. To make it possible for the relative positions of the two display panels to be changed in response to different rotating angles of the two bodies, a linkage structure for driving the display panel to move relative to the body is added to the hinge structure of some notebook computers. However, integrating the linkage structure into the hinge structure as described above causes the hinge structure subjected to additional force when in operation, and the linkage structure is likely to interfere with the structure and the operation of the hinge structure.

SUMMARY

The disclosure provides an electronic device capable of preventing adverse effects on a hinge structure caused by the configuration of a linkage structure.

The electronic device of the disclosure includes two bodies, at least one hinge structure, a functional assembly and at least one linkage structure. The two bodies are pivotally connected to each other through the hinge structure. The functional assembly is movably disposed on one of the two bodies. The linkage structure is connected between the two bodies, and the functional assembly is connected to the linkage structure. The linkage structure is adapted to drive the functional assembly to move relative to the corresponding body as the two bodies are rotated relative to each other.

In an embodiment of the disclosure, the linkage structure includes a first pivot assembly and two first shafts. The two bodies are respectively pivotally connected to the first pivot assembly through the two first shafts. The hinge structure includes a second pivot assembly and two second shafts. The two second shafts are pivotally connected to the second pivot assembly and respectively connected to the two bodies, and the two first shafts are separated from the two second shafts.

In an embodiment of the disclosure, the electronic device further includes another functional assembly. The another functional assembly is movably disposed on the other of the two bodies, the another functional assembly is connected to the linkage structure, and the linkage structure is adapted to drive the another functional assembly to move relative to the other corresponding body as the two bodies are rotated relative to each other.

In an embodiment of the disclosure, the linkage structure includes a first pivot assembly, two first shafts, and two linkage assemblies. The two linkage assemblies are respectively pivotally connected to the first pivot assembly through the two first shafts and respectively connected to the two bodies and the two functional assemblies.

In an embodiment of the disclosure, each of the linkage assemblies includes a first frame and a second frame. The first frame is fixed on the corresponding body and connected to the corresponding first shaft. The second frame is slidably disposed on the first frame along a first direction perpendicular to an axial direction of the corresponding first shaft and parallel to the corresponding display surface of the functional assembly and connected to the corresponding functional assembly. The first pivot assembly is adapted to drive the corresponding second frame to slide along the first direction relative to the corresponding first frame body along as the two bodies are rotated relative to each other, so that each of the corresponding functional assemblies driven by the second frame relative to the corresponding body is translated along the first direction.

In an embodiment of the disclosure, each of the linkage assemblies further includes a sliding element and a connecting rod. The sliding element is slidably disposed on the first frame along a second direction perpendicular to the first direction and parallel to a corresponding display surface of the functional assembly. The connecting rod is connected between the sliding element and the second frame. The first pivot assembly is adapted to drive the sliding element to slide relative to the first frame along the second direction, so that the sliding element drives the second frame to slide relative to the first frame along the first direction through the connecting rod.

In an embodiment of the disclosure, the first pivot assembly or the two first shafts include two guiding parts. The two guiding parts respectively correspond to the two sliding elements, and as each of the linkage assemblies is rotated relative to the first pivot assembly, the corresponding sliding element is guided by the corresponding guiding part to slide relative to the first frame along the second direction.

In an embodiment of the disclosure, each of the linkage assemblies further includes a third frame. The third frame is slidably disposed on the second frame along a third direction perpendicular to the first direction and perpendicular to a display surface of the corresponding functional assembly. Each of the functional assemblies is fixed on the corresponding third frame. When the third frame slides along the first direction with the second frame, the third frame is driven to slide along the third direction to drive the corresponding functional assembly relative to the corresponding body to move up and down along the third direction.

In an embodiment of the disclosure, each of the bodies includes a guiding structure corresponding to the third frame. When the third frame slides along the first direction with the second frame, the third frame is guided by the guiding structure to slide along the third direction.

In an embodiment of the disclosure, one end of each of the functional assemblies is fixed on the corresponding third frame, and another end of each of the functional assemblies is connected to the corresponding body in a translational and vertically movable manner, so that each of the functional assemblies in a collective manner is adapted to move up and down relative to the corresponding body as the corresponding third frame moves.

In an embodiment of the disclosure, one end of each of the functional assemblies is fixed on the corresponding third frame, and another end of each of the functional assemblies is connected to the corresponding body in a translational and movable manner, so that each of the functional assemblies in a collective manner is adapted to incline relative to the corresponding body as the corresponding third frame moves.

In an embodiment of the disclosure, when the two bodies are unfolded relative to each other from a closed state to a state with a first unfolding angle, the linkage structure does not drive each of the functional assemblies to move relative to the corresponding body. When the two bodies with the first unfolding angle continue to be unfolded relative to each other to a state with a second unfolding angle, the linkage structure drives each of the functional assemblies to move up and translate relative to the corresponding body so that the edges of the two functional assemblies are close to each other. When the two bodies with the second unfolding angle continue to be unfolded relative to each other to a state with a third unfolding angle, the linkage structure drives each of the functional assemblies to translate relative to the corresponding body so that the edges of the two functional assemblies are close to each other. When the two bodies with the third unfolding angle continue to be unfolded relative to each other to a state with a fourth unfolding angle, the linkage structure drives each of the functional assemblies to move down and translate relative to the corresponding body so that the edges of the two functional assemblies lean against each other. When the two bodies with the fourth unfolding angle continue to be unfolded relative to each other to a state with a fifth unfolding angle, the linkage structure drives each of the functional assemblies to translate relative to the corresponding body so that the edges of the two functional assemblies are apart from each other. When the two bodies with the fifth unfolding angle continue to be unfolded relative to each other to a state with a sixth unfolding angle, the linkage structure does not drive each of the functional assemblies to move relative to the corresponding body.

In an embodiment of the disclosure, the first unfolding angle, the second unfolding angle, the third unfolding angle, the fourth unfolding angle, the fifth unfolding angle, and the sixth unfolding angle are 20 degrees, 90 degrees, and 150 degrees, 180 degrees, 210 degrees, and 360 degrees respectively.

In an embodiment of the disclosure, when the two bodies are unfolded relative to each other from a closed state to a state with a first unfolding angle, the linkage structure does not drive each of the functional assemblies to move relative to the corresponding body. When the two bodies with the first unfolding angle continue to be unfolded relative to each other to a state with a second unfolding angle, the linkage structure drives each of the functional assemblies to move up and translate relative to the corresponding body so that the edges of the two functional assemblies are close to each other. When the two bodies with the second unfolding angle continue to be unfolded relative to each other to a state with a third unfolding angle, the linkage structure drives each of the functional assemblies to translate relative to the corresponding body so that the edges of the two functional assemblies are close to each other. When the two bodies with the third unfolding angle continue to be unfolded relative to each other to a state with a fourth unfolding angle, the linkage structure drives each of the functional assemblies to translate relative to the corresponding body so that the edges of the two functional assemblies lean against each other. When the two bodies with the fourth unfolding angle continue to be unfolded relative to each other to a state with a fifth unfolding angle, the linkage structure drives each of the functional assemblies to move down and translate relative to the corresponding body so that the edges of the two functional assemblies are apart from each other. When the two bodies with the fifth unfolding angle continue to be unfolded relative to each other to a state with a sixth unfolding angle, the linkage structure does not drive each of the functional assemblies to move relative to the corresponding body.

In an embodiment of the disclosure, the first unfolding angle, the second unfolding angle, the third unfolding angle, the fourth unfolding angle, the fifth unfolding angle, and the sixth unfolding angle are 20 degrees, 90 degrees, 150 degrees, 180 degrees, 210 degrees, and 360 degrees respectively.

In an embodiment of the disclosure, the electronic device further includes at least one cover. The cover is disposed between the hinge structure and the linkage structure and covers part of the hinge structure and part of the linkage structure.

In an embodiment of the disclosure, the cover includes a retaining wall, and the retaining wall separates the hinge structure and linkage structure.

In an embodiment of the disclosure, the electronic device further includes a cover. The number of the linkage structure is two, and the cover is disposed between the two linkage structures and covers part of each of the linkage structures.

In an embodiment of the disclosure, the cover includes a retaining wall, and the retaining wall separates the two linkage structures.

Based on the above, in the electronic device of the disclosure, the linkage structure is not a structure included in the hinge structure, so the linkage structure can be independently disposed and apart from the hinge structure instead of being integrated into the hinge structure. Accordingly, when in operation, the hinge structure is not subjected to additional force caused by the configuration of the linkage structure, and the linkage structure disposed independently does not interfere with the structure and the operation of the hinge structure.

DESCRIPTION OF THE EMBODIMENTS

Figure 1:
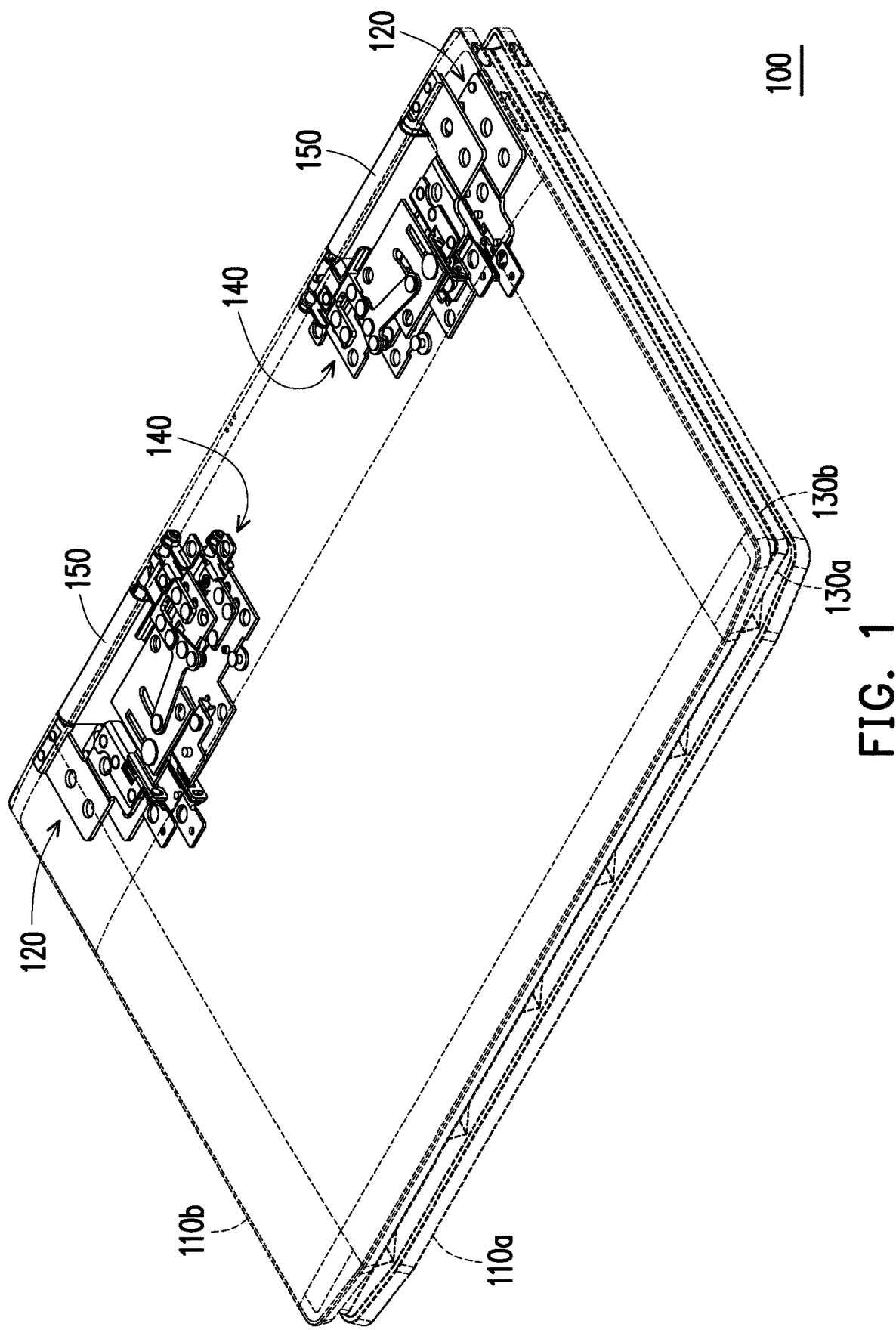
FIG. 1 is a perspective view of an electronic device according to an embodiment of the disclosure.

FIG. 1 is a perspective view of an electronic device according to an embodiment of the disclosure. Referring to FIG. 1, an electronic device 100 in the embodiment includes a body 110a, a body 110b, at least one hinge structure 120 (two hinge structures are shown), a functional assembly 130a, a functional assembly 130b, and at least one linkage structure 140 (two linkage structures 140 are shown). The two bodies 110a and 110b are pivotally connected to each other through the two hinge structures 120. The two functional assemblies 130a and 130b are, for example, display panels and are respectively movably disposed on the two bodies 110a and 110b. Each of the linkage structures 140 is connected between the two bodies 110a and 110b and separated from each of the hinge structures 120, and each of the functional assemblies 130a and 130b is connected to the two linkage structures 140. In other embodiments, the functional assemblies 130a and 130b may be a display panel and an input device (e.g., a keyboard or a touch pad), respectively, or may be other types of elements, respectively. The disclosure is not limited thereto. In other words, the two functional assemblies of the disclosure may be the same or different from each other. For example, they may be both or respectively a display panel, a touch-sensitive display panel, a keyboard, a touch pad, a speaker, a combination of a keyboard and a touch pad, a combination of a display and an input device, etc. The disclosure is not limited thereto. In addition, each of the functional assemblies may be respectively electrically connected to at least one of the two bodies, and the connection is not limited to a wired form or a wireless form. Furthermore, in some embodiments, the electronic device 100 may include one of the functional assemblies 130a and 130b but may not include the other of the functional assemblies 130a and 130b.

Figure 2A:
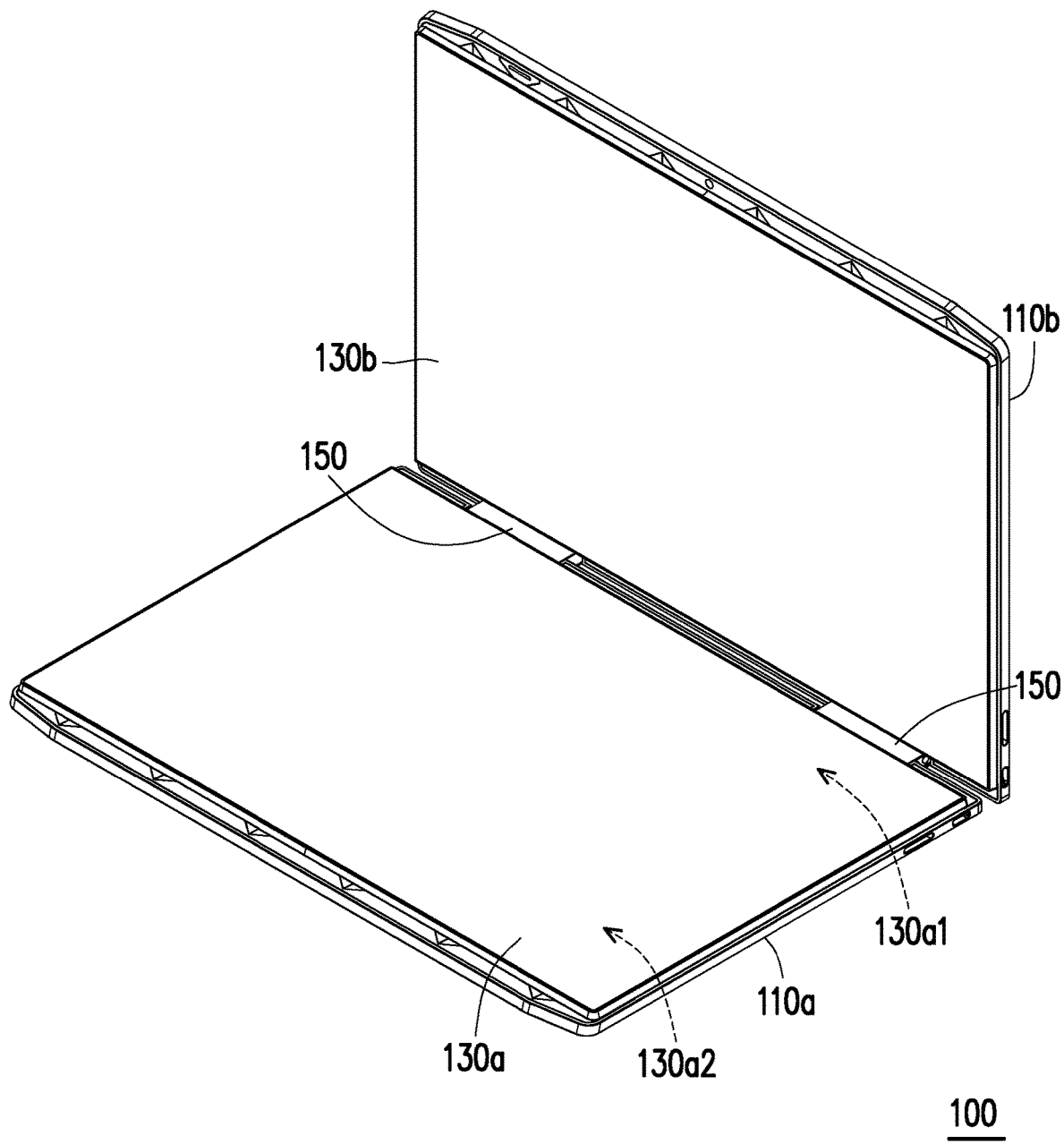
FIG. 2A to FIG. 2C illustrate the two bodies of FIG. 1 rotated relative to each other.
Figure 2B:
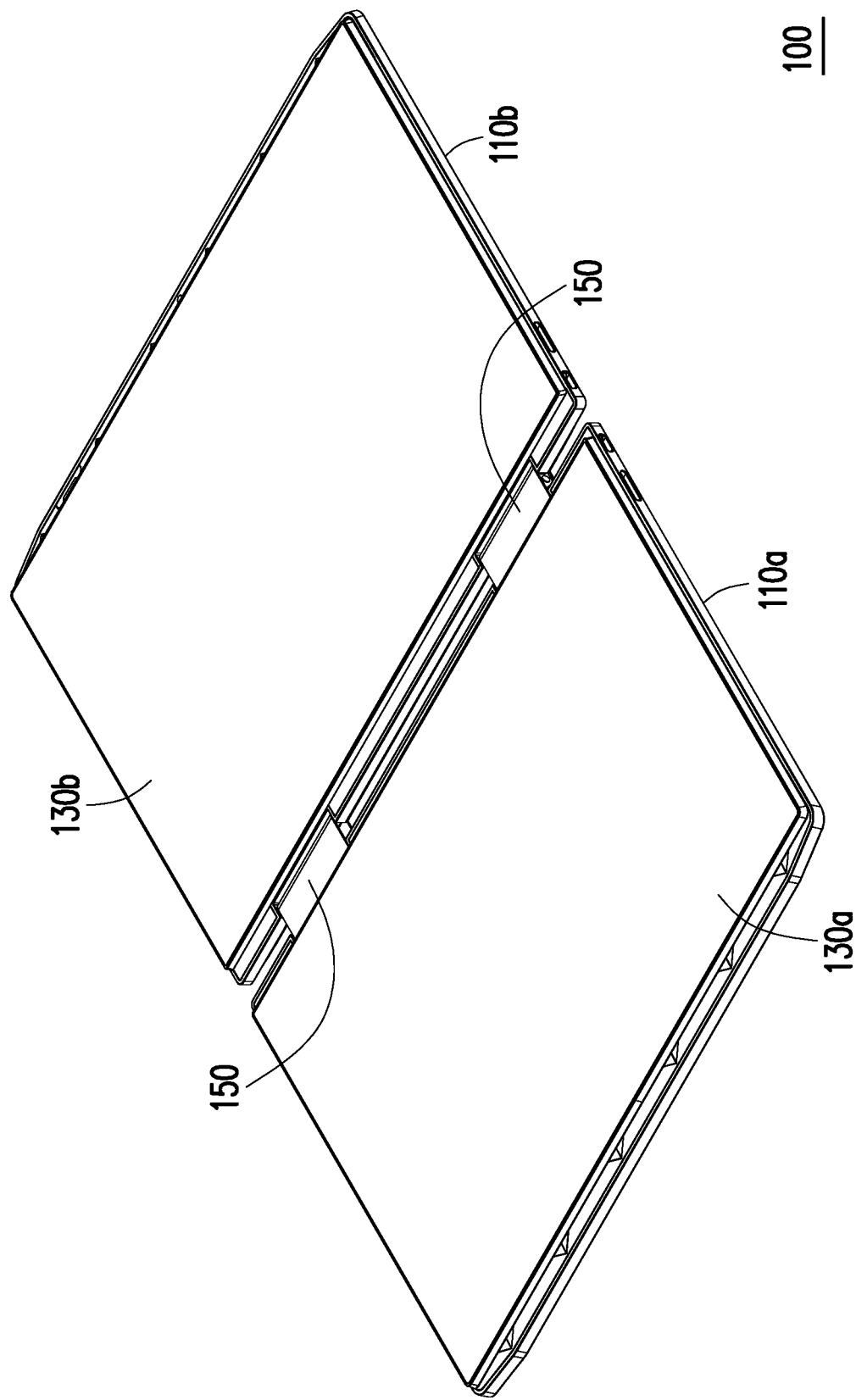
Figure 2C:
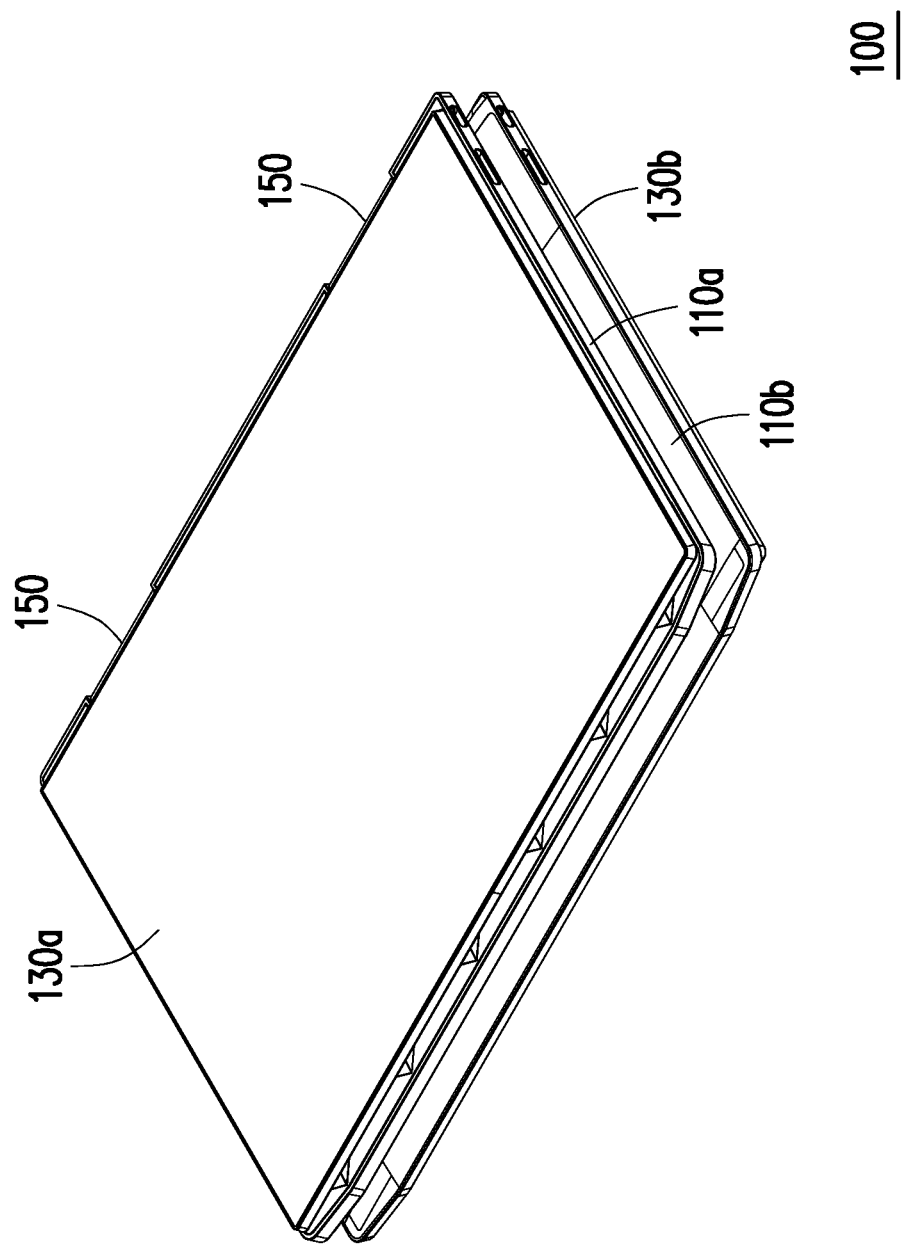
Figure 3A:
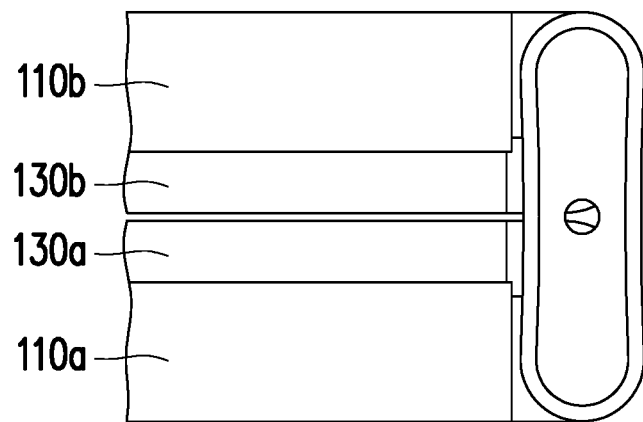
FIG. 3A to FIG. 3G are schematic views of the rotating process of the electronic device of FIG. 1.
Figure 3B:
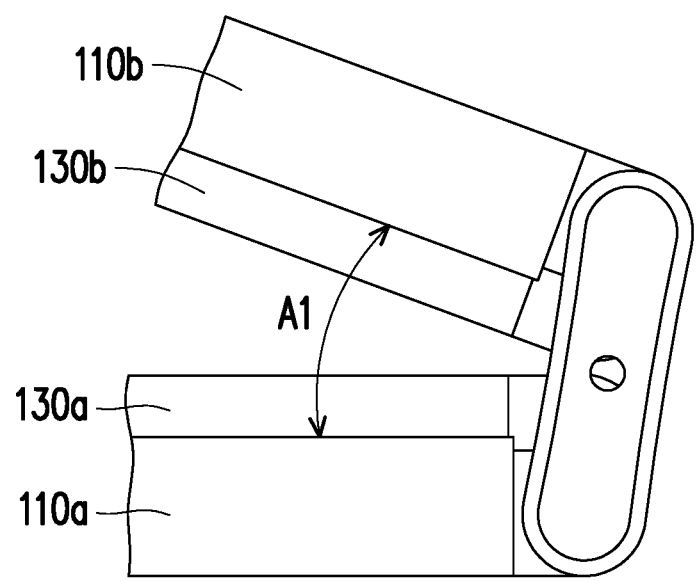
Figure 3C:
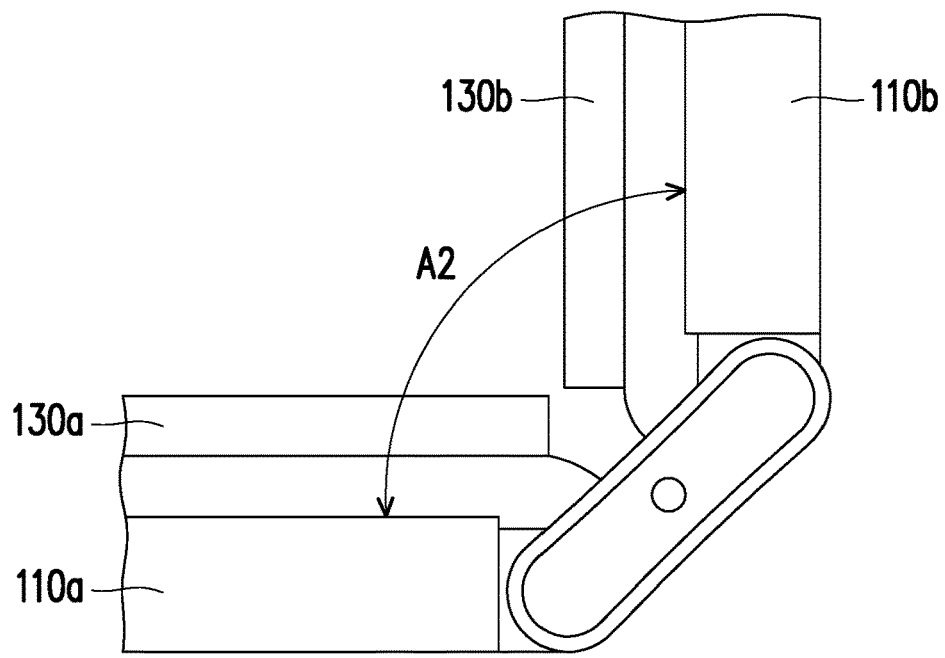
Figure 3D:
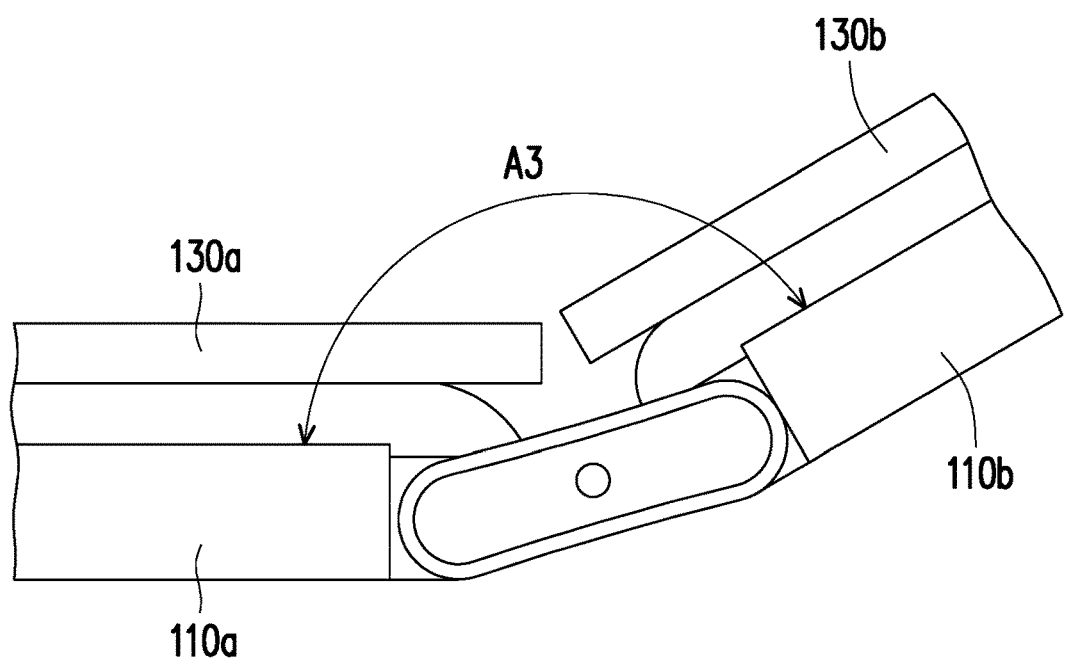
Figure 3E:
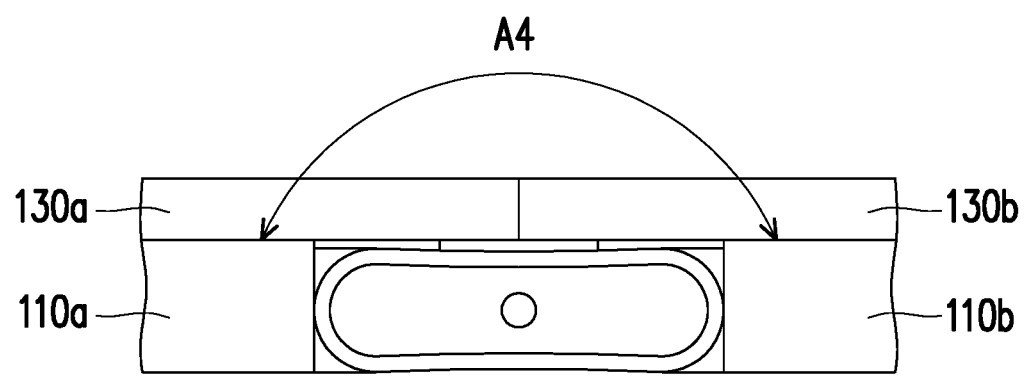
Figure 3F:
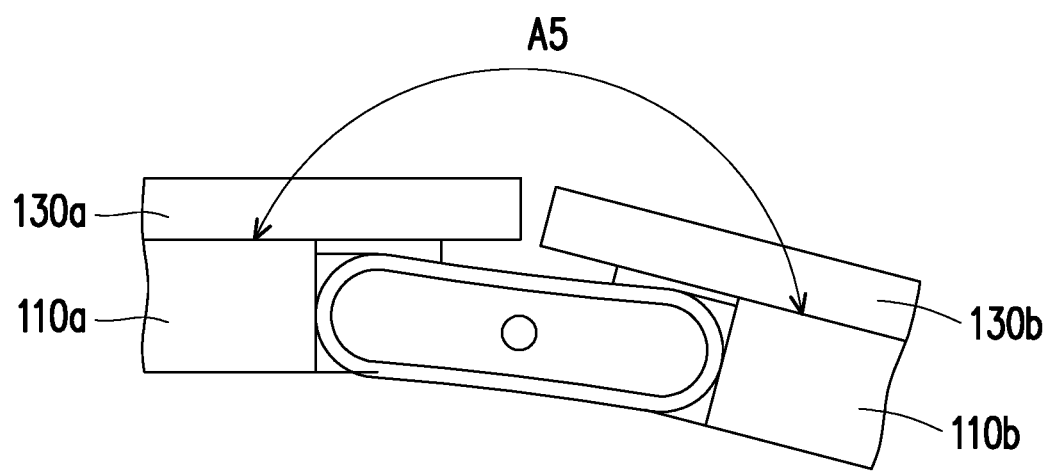
Figure 3G:
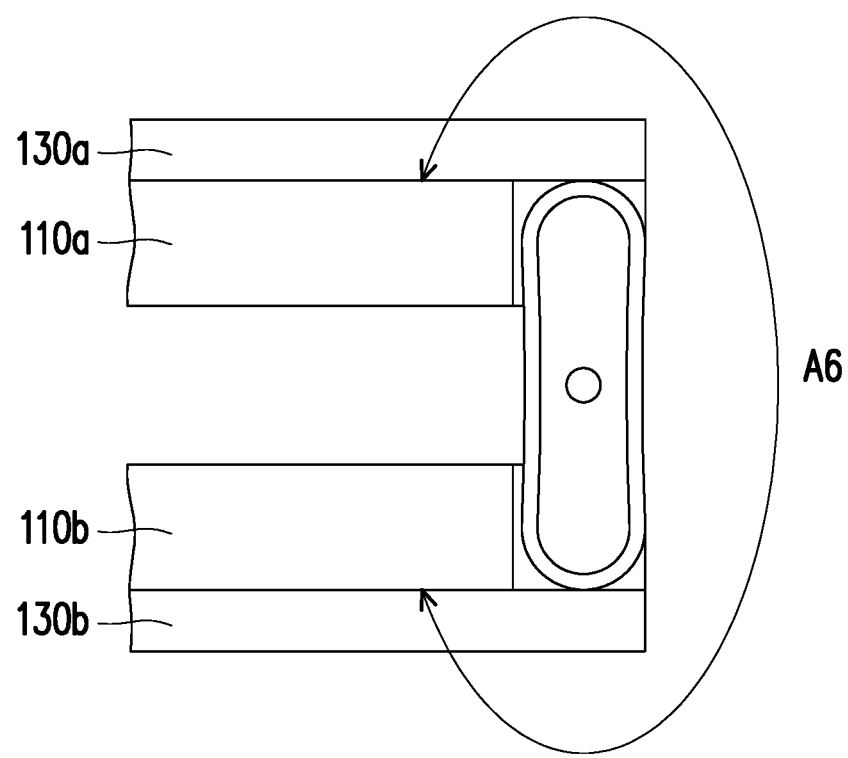
Figure 4A:
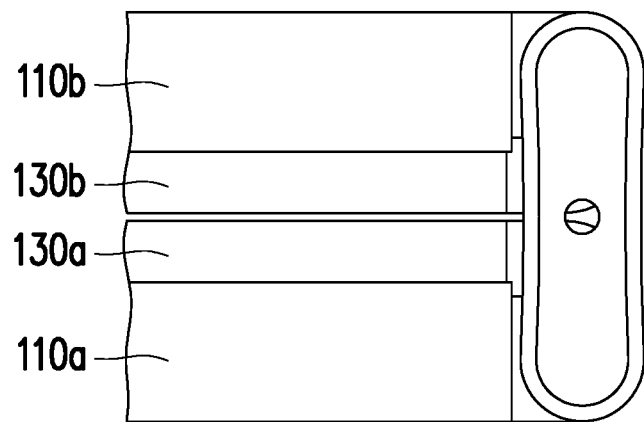
FIG. 4A to FIG. 4G are schematic views of the rotating process of an electronic device according to another embodiment of the disclosure.
Figure 4B:
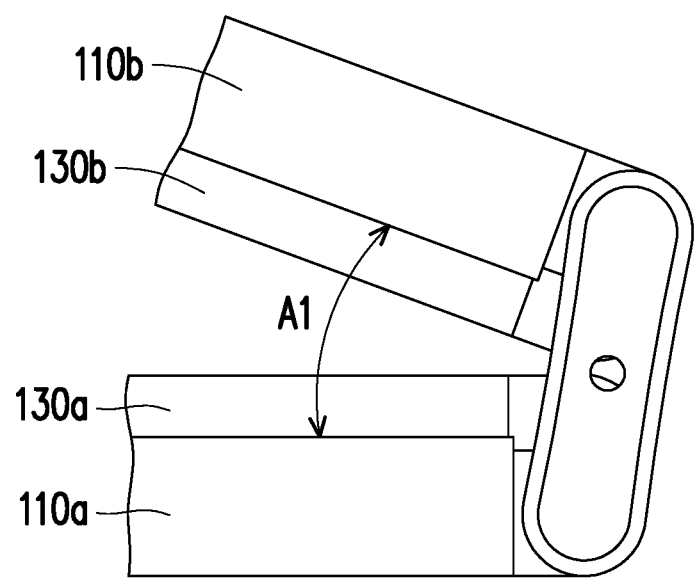
Figure 4C:
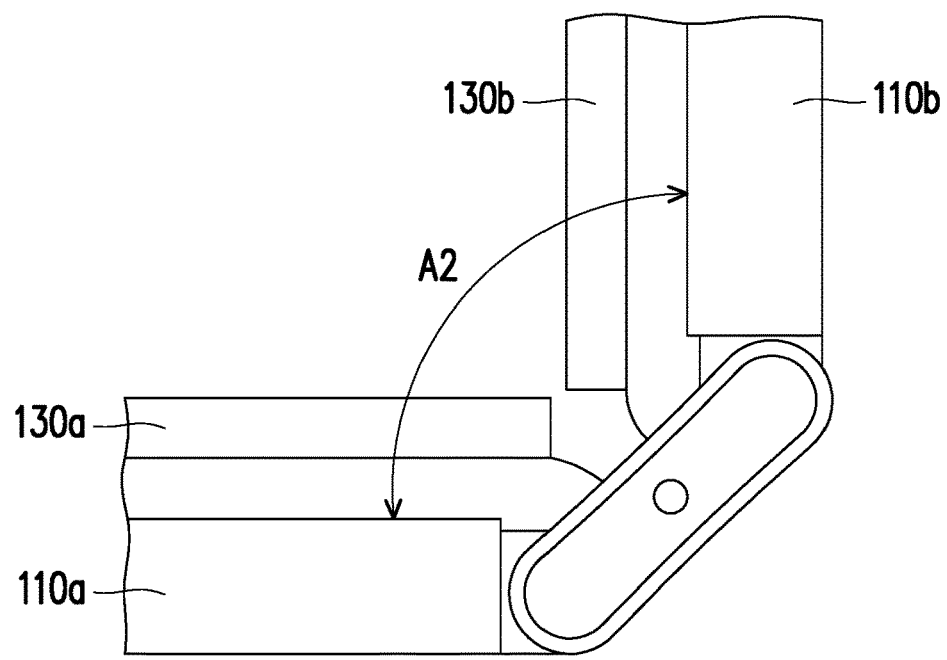
Figure 4D:
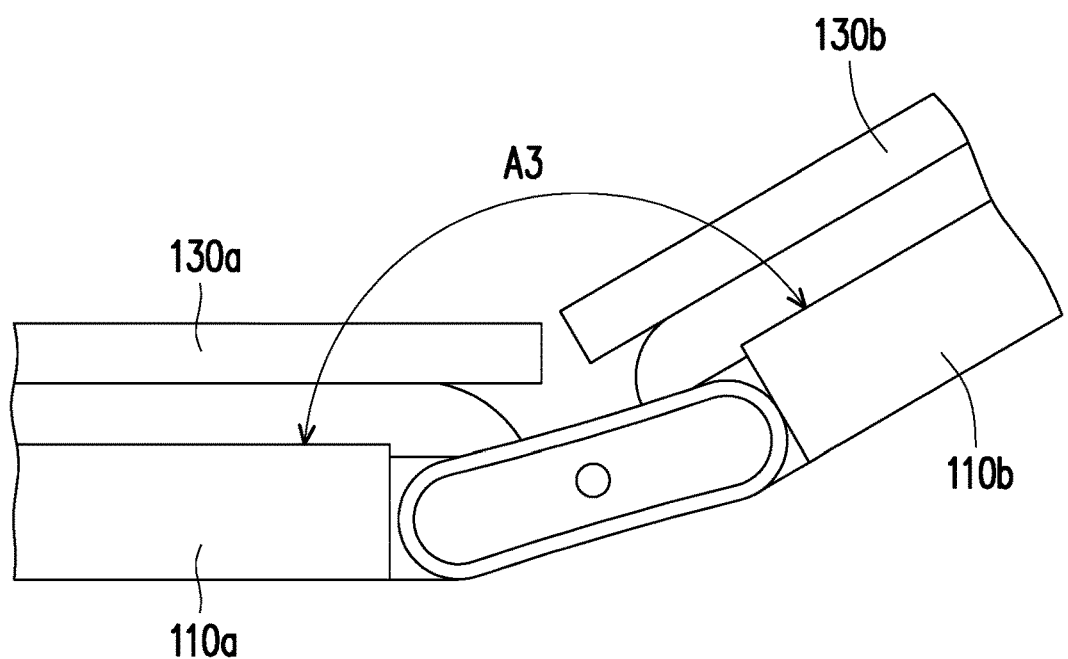
Figure 4E:
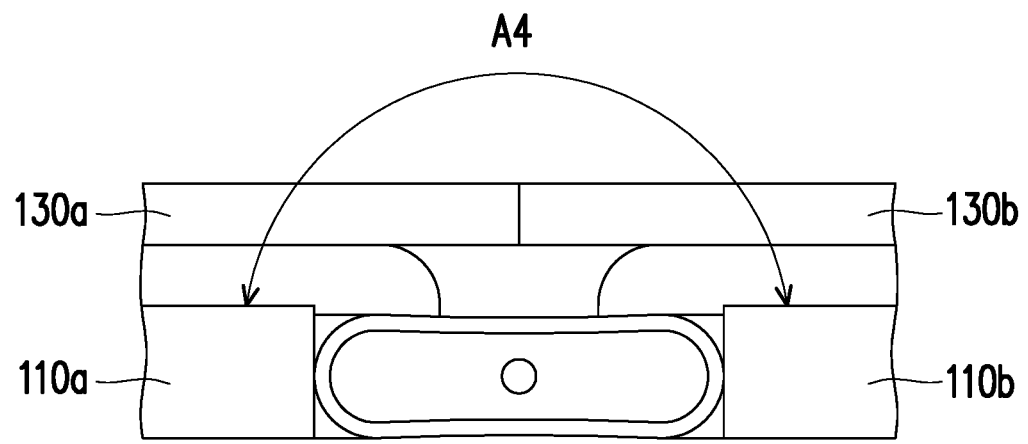
Figure 4F:
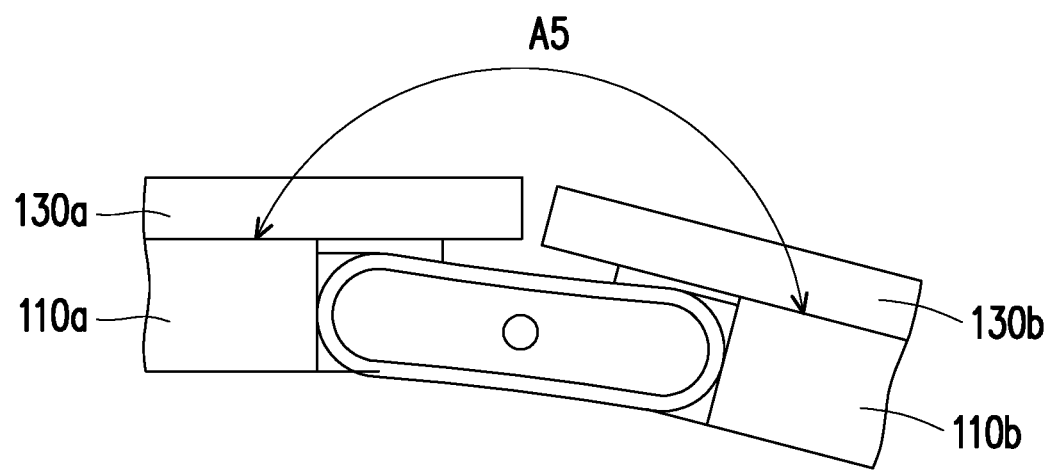
Figure 4G:
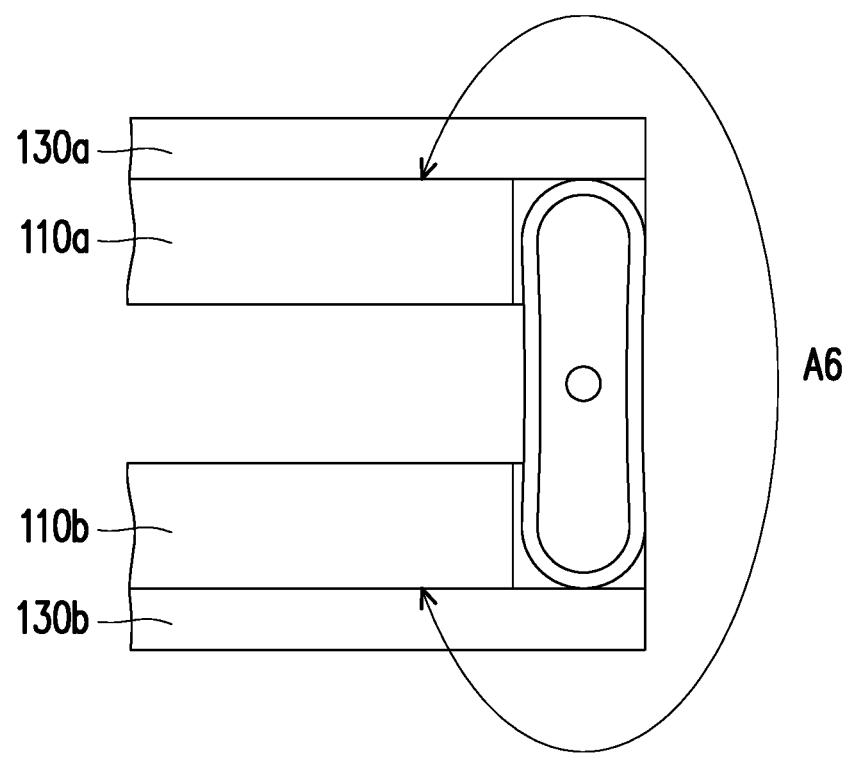

FIG. 2A to FIG. 2C illustrate the two bodies of FIG. 1 rotated relative to each other. The two bodies 110a and 110b are rotated relative to each other from a closed state shown in FIG. 1 to an unfolded state shown in FIG. 2A, from the unfolded state shown in FIG. 2A to a flattened state shown in FIG. 2B, and from the flattened state shown in FIG. 2B to a reflexed state shown in FIG. 2C through the pivotal rotation of each of the hinge structures 120. In addition, each of the linkage structures 140 drives each of the functional assemblies 130a and 130b to move relative to the corresponding bodies 110a and 110b as the two bodies are rotated relative to each other.

Based on the above, each of the linkage structures 140 is not a structure included in the hinge structure 120, so the linkage structure 140 may be independently disposed and apart from the hinge structure 120 instead of being integrated into the hinge structure 120. Accordingly, when in operation, the hinge structure 120 is not subjected to additional force caused by the configuration of the linkage structure 140, and the linkage structure 140 disposed independently does not interfere with the structure and the operation of the hinge structure 120.

FIG. 3A to FIG. 3G are schematic views of the rotating process of the electronic device in FIG. 1. For example, when the two bodies 110a and 110b are unfolded relative to each other from the closed state shown in FIG. 3A to the state shown in FIG. 3B and have a first unfolding angle A1 (e.g., 20 degrees), each of the linkage structures 140 (shown in FIG. 1) does not drive each of the functional assemblies 130a and 130b to move relative to the corresponding bodies 110a and 110b. When the two bodies 110a and 110b with the first unfolding angle A1 continue to be unfolded relative to each other from the state shown in FIG. 3B to the state shown in FIG. 3C and have a second unfolding angle A2 (e.g., 90 degrees), each of the linkage structures 140 (shown in FIG. 1) drives each of the functional assemblies 130a and 130b to move up and translate relative to the corresponding bodies 110a and 110b so that the edges of the two functional assemblies 130a and 130b are close to each other. When the two bodies 110a and 110b with the second unfolding angle A2 continue to be unfolded relative to each other from the state shown in FIG. 3C to the state shown in FIG. 3D and have a third unfolding angle A3 (e.g., 150 degrees), each of the linkage structures 140 (shown in FIG. 1) drives each of the functional assemblies 130a and 130b to translate relative to the corresponding bodies 110a and 110b so that the edges of the two functional assemblies 130a and 130b are close to each other. When the two bodies 110a and 110b with the third unfolding angle A3 continue to be unfolded relative to each other from the state shown in FIG. 3D to the state shown in FIG. 3E and have a fourth unfolding angle A4 (e.g., 180 degrees), each of the linkage structures 140 (shown in FIG. 1) drives each of the functional assemblies 130a and 130b to move down and translate relative to the corresponding bodies 110a and 110b so that the edges of the two functional assemblies 130a and 130b lean against each other. When the two bodies 110a and 110b with the fourth unfolding angle A4 continue to be unfolded relative to each other from the state shown in FIG. 3E to the state shown in FIG. 3F and have a fifth unfolding angle A5 (e.g., 210 degrees), each of the linkage structures 140 (shown in FIG. 1) drives each of the functional assemblies 130a and 130b to translate relative to the corresponding bodies 110a and 110b so that the edges of the two functional assemblies 130a and 130b are apart from each other. When the two bodies 110a and 110b with the fifth unfolding angle A5 continue to be unfolded relative to each other from the state shown in FIG. 3F to the state shown in FIG. 3G and have a sixth unfolding angle A6 (e.g., 360 degrees), each of the linkage structures 140 (shown in FIG. 1) does not drive each of the functional assemblies 130a and 130b to move relative to the corresponding bodies 110a and 110b.

Note that the operation flow shown in FIG. 3A to FIG. 3G is merely illustrative, and the disclosure does not limit the timing for each of the functional assemblies 130a and 130b to move up, move down, and translate. Another operation flow is described below. FIG. 4A to FIG. 4G are schematic views of the rotating process of an electronic device according to another embodiment of the disclosure. When the two bodies 110a and 110b are unfolded relative to each other from the closed state shown in FIG. 4A to the state shown in FIG. 4B and have the first unfolding angle A1 (e.g., 20 degrees), each of the linkage structures 140 (shown in FIG. 1) does not drive each of the functional assemblies 130a and 130b to move relative to the corresponding bodies 110a and 110b. When the two bodies 110a and 110b with the first unfolding angle A1 continue to be unfolded relative to each other from the state shown in FIG. 4B to the state shown in FIG. 4C and have the second unfolding angle A2 (e.g., 90 degrees), each of the linkage structures 140 (shown in FIG. 1) drives each of the functional assemblies 130a and 130b to move up and translate relative to the corresponding bodies 110a and 110b so that the edges of the two functional assemblies 130a and 130b are close to each other. When the two bodies 110a and 110b with the second unfolding angle A2 continue to be unfolded relative to each other from the state shown in FIG. 4C to the state shown in FIG. 4D and have the third unfolding angle A3 (e.g., 150 degrees), each of the linkage structures 140 (shown in FIG. 1) drives each of the functional assemblies 130a and 130b to translate relative to the corresponding bodies 110a and 110b so that the edges of the two functional assemblies 130a and 130b are close to each other. When the two bodies 110a and 110b with the third unfolding angle A3 continue to be unfolded relative to each other from the state shown in FIG. 4D to the state shown in FIG. 4E and have the fourth unfolding angle A4 (e.g., 180 degrees), each of the linkage structures 140 (shown in FIG. 1) drives each of the functional assemblies 130a and 130b to translate relative to the corresponding bodies 110a and 110b so that the edges of the two functional assemblies 130a and 130b lean against each other. When the two bodies 110a and 110b with the fourth unfolding angle A4 continue to be unfolded relative to each other from the state shown in FIG. 4E to the state shown in FIG. 4F and have the fifth unfolding angle A5 (e.g., 210 degrees), each of the linkage structures 140 (shown in FIG. 1) drives each of the functional assemblies 130a and 130b to move down and translate relative to the corresponding bodies 110a and 110b so that the edges of the two functional assemblies 130a and 130b are apart from each other. When the two bodies 110a and 110b with the fifth unfolding angle A5 continue to be unfolded relative to each other from the state shown in FIG. 4F to the state shown in FIG. 4G and have the sixth unfolding angle A6 (e.g., 360 degrees), each of the linkage structures 140 (shown in FIG. 1) does not drive each of the functional assemblies 130a and 130b to move relative to the corresponding bodies 110a and 110b.

In the embodiment, the hinge structure 120 is, for example, in the form of dual shafts, the linkage structure 140 is also, for example, in the form of dual shafts, and the shaft of the linkage structure 140 and the shaft of the hinge structure 120 are separated from each other. That is, the linkage structure 140 and the hinge structure 120 do not share a shaft, so that the linkage structure 140 is independently disposed and apart from the hinge structure 120 as described above. Accordingly, when in operation, the hinge structure 120 is not subjected to additional force caused by the configuration of the linkage structure 140, and the linkage structure 140 disposed independently does not interfere with the structure and the operation of the hinge structure 120. This is illustrated with reference to the drawings below.

Figure 5:
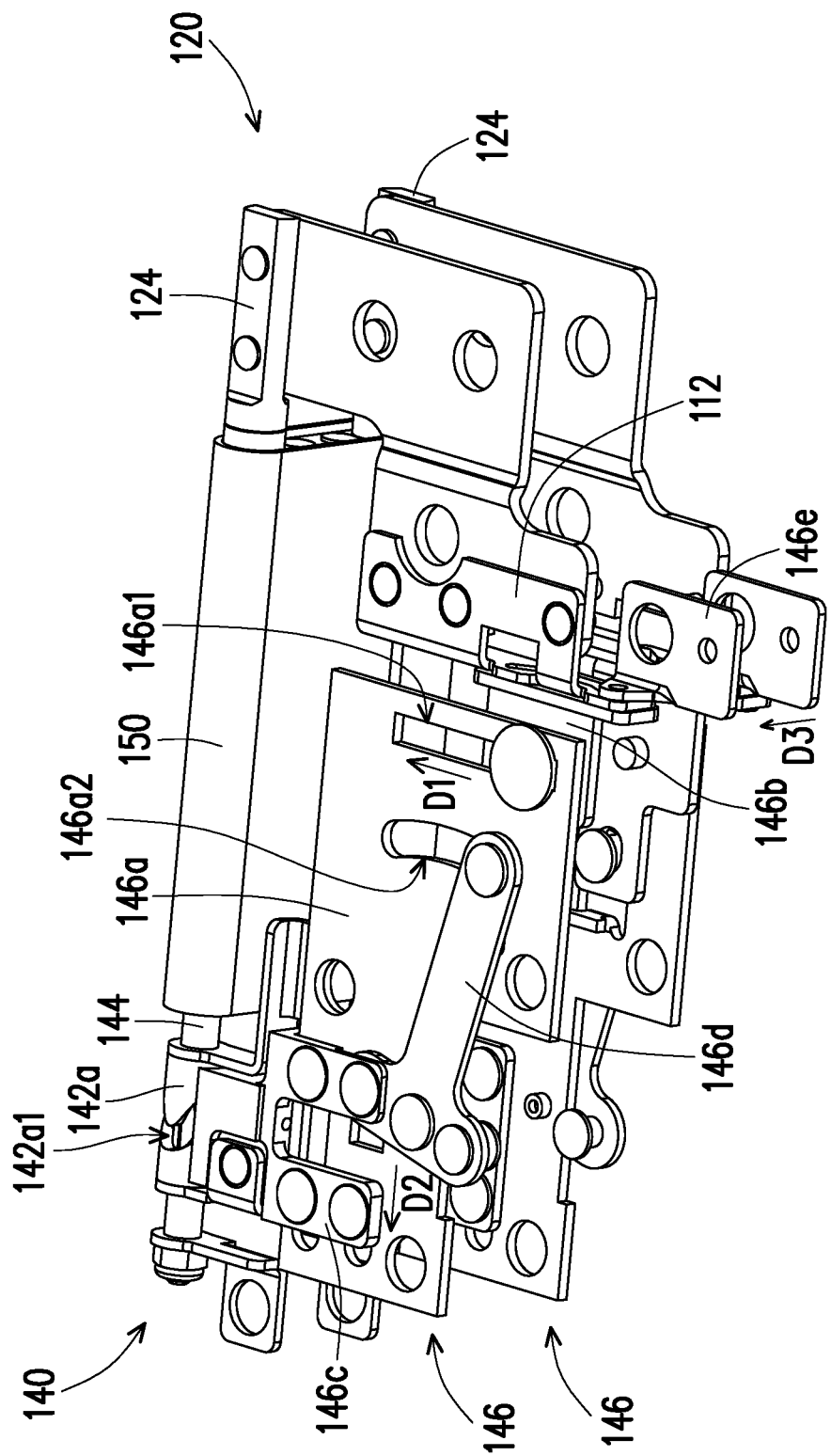
FIG. 5 is a perspective view of the linkage structure, the hinge structure, and the cover of FIG. 1.
Figure 6:
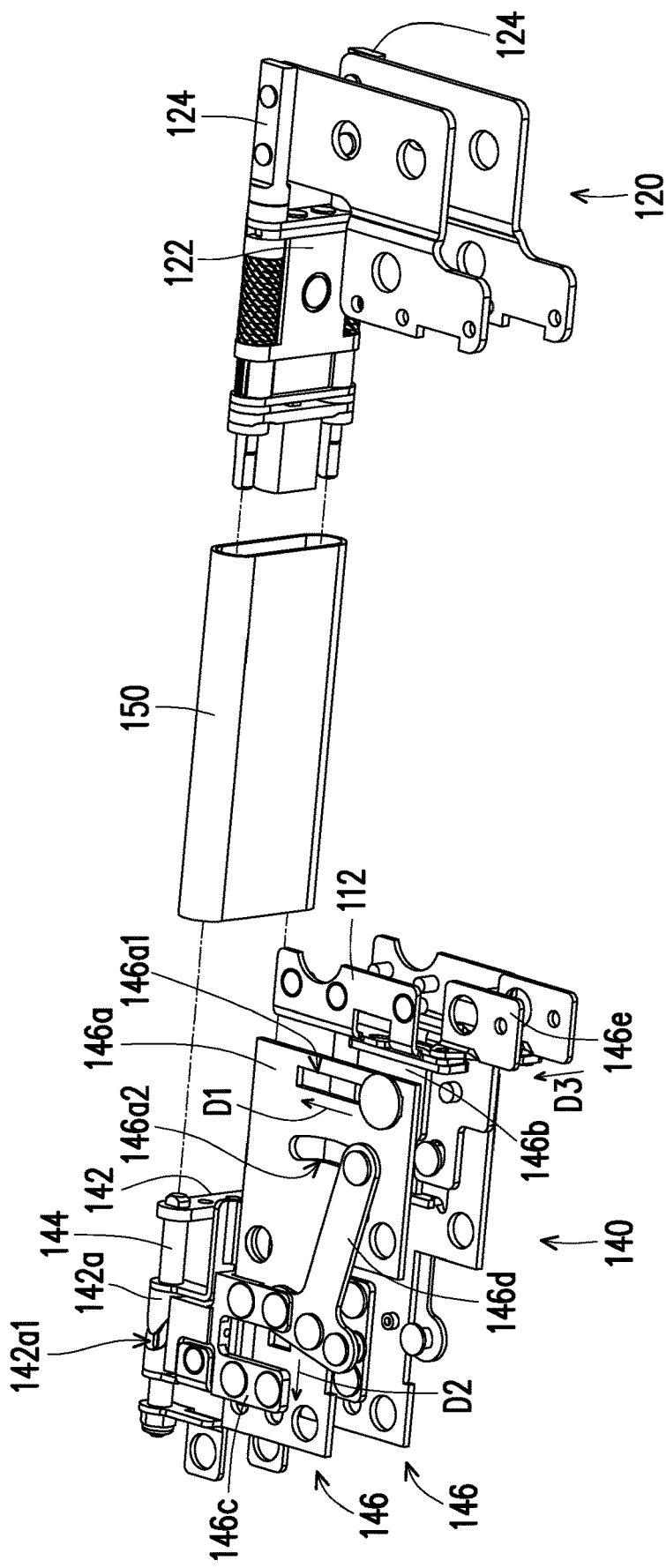
FIG. 6 is an exploded view of the linkage structure, the hinge structure, and the cover of FIG. 5.
Figure 7:
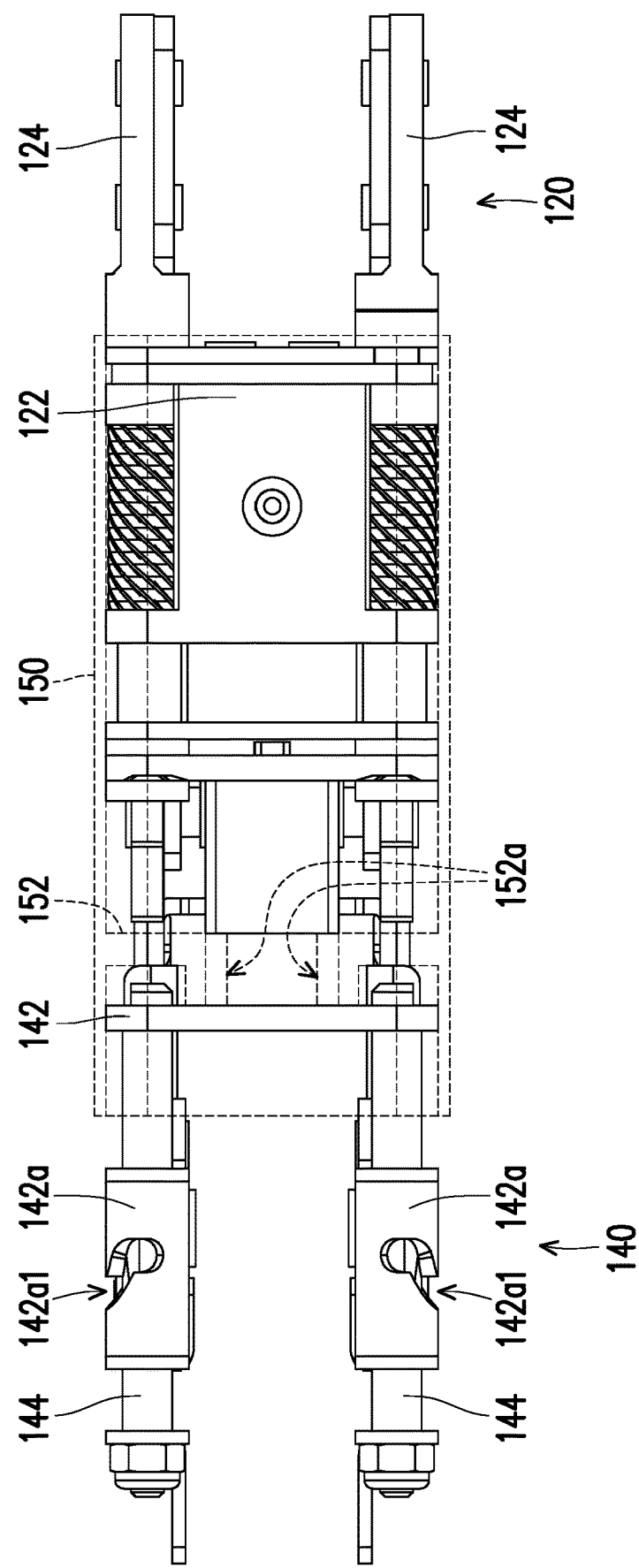
FIG. 7 is a rear view of the linkage structure, the hinge structure, and the cover of FIG. 5.

FIG. 5 is a perspective view of the linkage structure, the hinge structure, and the cover of FIG. 1. FIG. 6 is an exploded view of the linkage structure, the hinge structure, and the cover of FIG. 5. FIG. 7 is a rear view of the linkage structure, the hinge structure, and the cover of FIG. 5. Referring to FIG. 5 to FIG. 7, the linkage structure 140 in the embodiment includes a first pivot assembly 142 and two first shafts 144. The two bodies 110a and 110b (shown in FIG. 1) respectively are pivotally connected to the first pivot assembly 142 through the two first shafts 144. The hinge structure 120 includes a second pivot assembly 122 and two second shafts 124. The two second shafts 124 are pivotally connected to the second pivot assembly 122 and are respectively connected to the two bodies 110a and 110b (shown in FIG. 1). In addition, the two first shafts 144 of the linkage structure 140 are separated from the two second shafts 124 of the hinge structure 120.

The electronic device 100 in the embodiment as shown in FIG. 5 to FIG. 7 further includes at least one cover 150 (two covers 150 are shown in FIG. 1). The cover 150 is disposed between the hinge structure 120 and the linkage structure 140 and covers part of the hinge structure 120 and part of the linkage structure 140. The cover 150 has a retaining wall 152 (shown in FIG. 7). The retaining wall 152 separates the hinge structure 120 and the linkage structure 140, so that the hinge structure 120 and the linkage structure 140 maintain a predetermined relative position after being assembled with the cover 150. In addition, the cover 150 may have a fastening hole 152a in the retaining wall 152 for the hinge structure 120 and the linkage structure 140 to be fastened.

Figure 8:
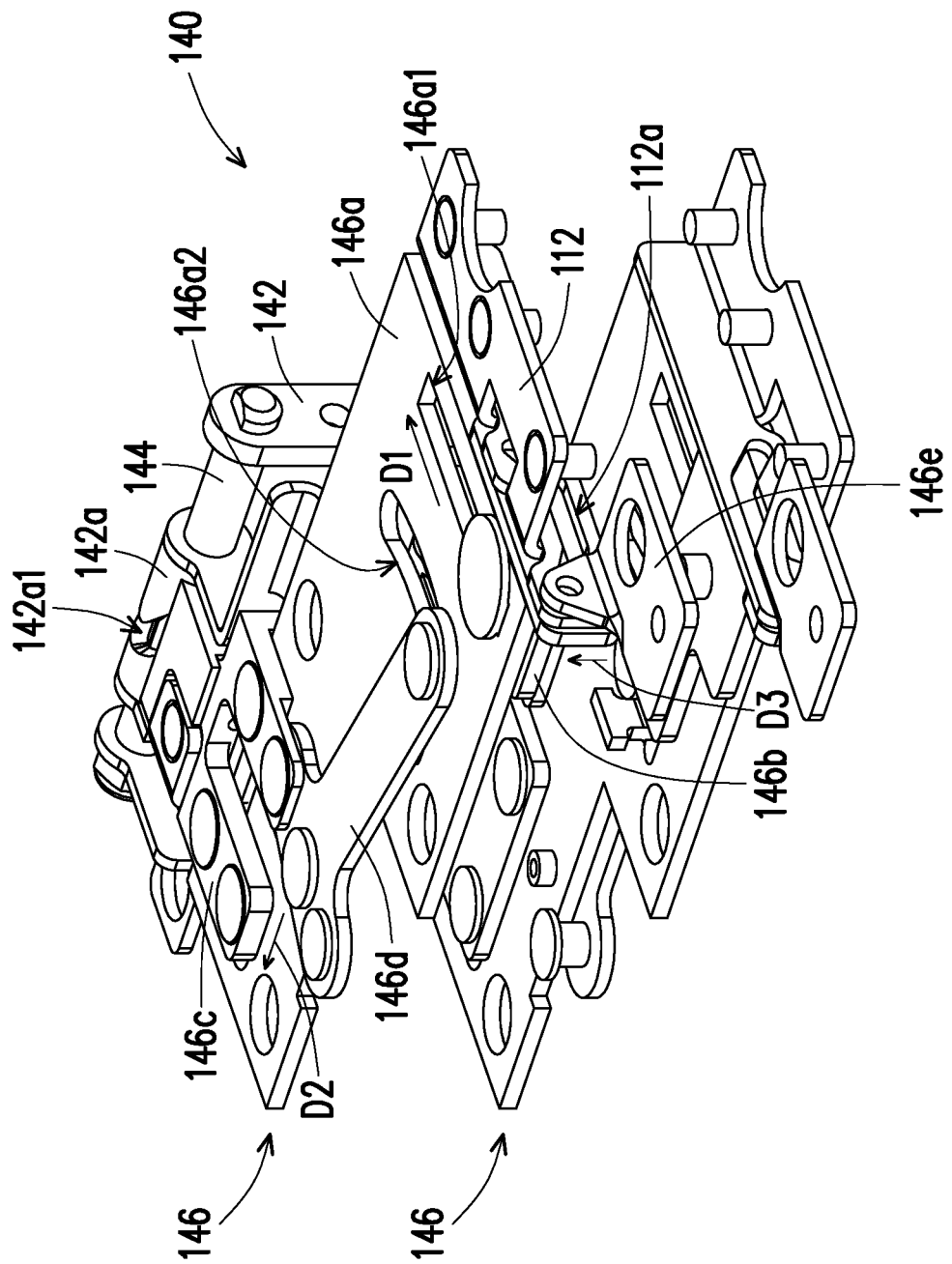
FIG. 8 is a perspective view of the linkage structure of FIG. 6.

The configuration and the operation of the linkage structure 140 in the embodiment are described in detail below. FIG. 8 is a perspective view of the linkage structure of FIG. 6. Referring to FIG. 5, FIG. 6, and FIG. 8, the linkage structure 140 in the embodiment further includes two linkage assemblies 146, and the two first shafts 144 are respectively connected to the two bodies 110a and 110b (shown in FIG. 1) and the two functional assemblies 130a and 130b (shown in FIG. 1) through the two linkage assemblies 146. Specifically, each of the linkage assemblies 146 includes a first frame 146a and a second frame 146b. The first frame 146a is fixed on the corresponding body 110a (or 110b) and connected to the corresponding first shaft 144. The second frame 146b is slidably disposed in a sliding groove 146a1 of the first frame 146a along a first direction D1 perpendicular to the axial direction of the corresponding first shaft 144 and parallel to the display surface of the corresponding functional assembly 130a (or 130b) and connected to the corresponding functional assembly 110a (or 110b). The first pivot assembly 142 is adapted to drive the corresponding second frame 146b to slide along the first direction D1 relative to the corresponding first frame 146a as the two bodies 110a and 110b are rotated relative to each other, so that each of the second frames 146b drives the corresponding functional assembly 130a (or 130b) to translate along the first direction D1 relative to the corresponding body 110a (or 110b).

More specifically, each of the linkage assemblies 146 further includes a sliding element 146c and a connecting rod 146d. The sliding element 146c is slidably disposed on the first frame 146a along a second direction D2 perpendicular to the first direction D1 and parallel to the display surface of the corresponding functional assembly 130a (or 130b). The connecting rod 146d is connected between the sliding element 146c and the second frame 146b. The first pivot assembly 142 has two guiding parts 142a, and the two guiding parts 142a respectively correspond to the two sliding elements 146c. As each of the linkage assemblies 146 is rotated relative to the first pivot assembly 142, the sliding element 146c guided by the guiding part 142a of the first pivot assembly 142 is driven by the first pivot assembly 142 to slide along the second direction D2 relative to the first frame 146a, so that the sliding element 146c drives the second frame 146b to slide along the first direction D1 relative to the first frame 146a through the connecting rod 146d. Accordingly, the functional assembly 130a (or 130b) connected to the second frame 146b may be translated relative to the body 110a (or 110b) as shown in the operation flow of FIG. 3A to FIG. 3G or the operation flow of FIG. 4A to FIG. 4G.

In the embodiment, each of the guiding parts 142a has, for example, a guiding groove 142a1. Each of the sliding elements 146c has, for example, a protrusion, and the protrusion extends into the guiding groove 142a1. The guiding groove 142a1 includes an inclined section and guides each of the sliding elements 146c to slide along the second direction D2 as each of the linkage assemblies 146 is rotated relative to the first pivot assembly 142 as described above. In other embodiments, by changing the extending mode of the guiding groove 142a1, the timing for the functional assemblies 130a and 130b to be translated may be changed accordingly. The disclosure is not limited thereto. In addition, in other embodiments, each of the guiding parts 142a may guide the sliding element 146c to slide through other suitable structures, and the disclosure is not limited thereto. In addition, in the embodiment, one end of the connecting rod 146d is pivotally connected to the sliding element 146c, and another end of the connecting rod 146d is slidably disposed in an arc-shaped groove 146a2 of the first frame 146a and is rotatably and slidably connected to the second frame 146b, so that the sliding element 146c sliding along the second direction D2 is capable of driving the second frame 146b to slide along the first direction D1 through the connecting rod 146d. In other embodiments, the second frame 146b may be driven by other appropriate linkage assemblies, and the disclosure is not limited thereto.

Figure 9:
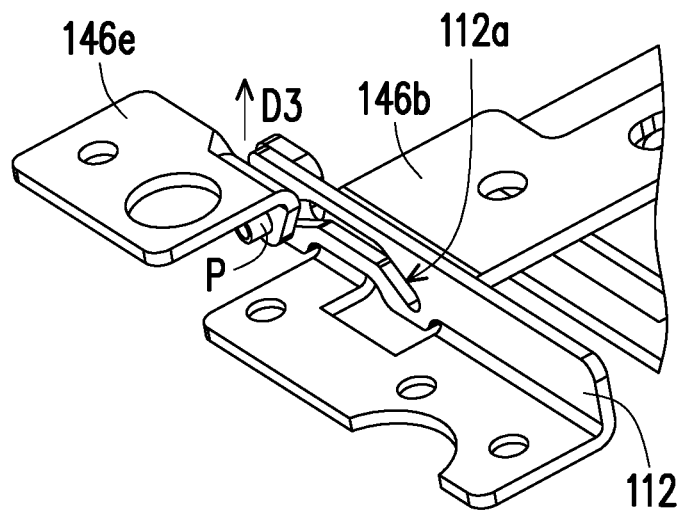
FIG. 9 is a perspective view of part of the linkage structure of FIG. 8.
Figure 10:
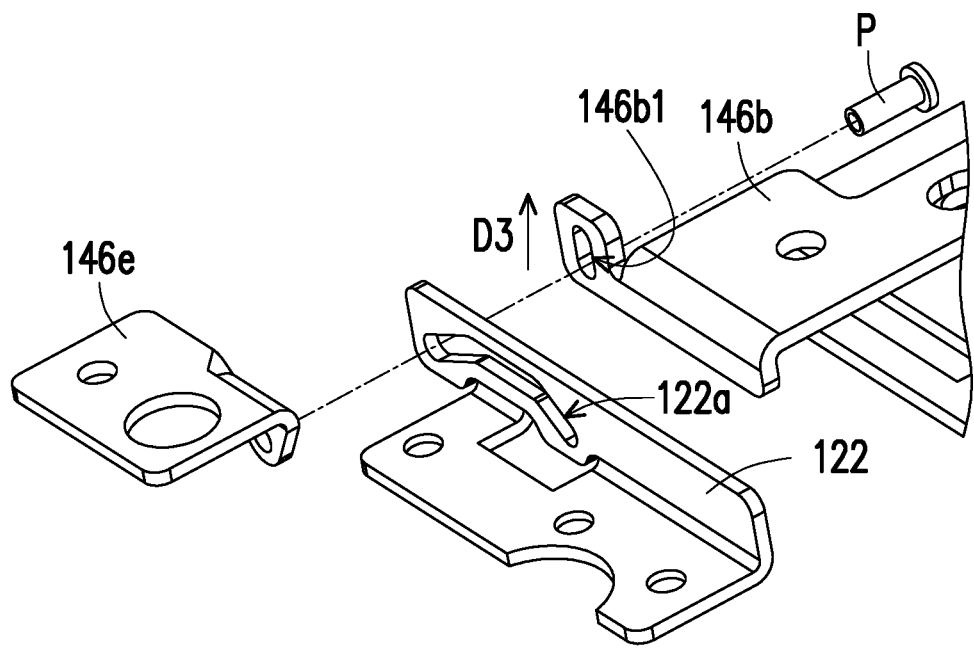
FIG. 10 is an exploded view of the linkage structure of FIG. 9.

FIG. 9 is a perspective view of part of the linkage structure of FIG. 8. FIG. 10 is an exploded view of the linkage structure of FIG. 9. Referring to FIG. 8 to FIG. 10, each of the linkage assemblies 146 in the embodiment further includes a third frame 146e. The third frame 146e is slidably disposed on a sliding groove 146b1 of the second frame 146b along a third direction D3 perpendicular to the first direction D1 and perpendicular to the display surface of the corresponding functional assembly 130a (or 130b) through a pin P, and each of the functional assemblies 130a and 130b is fixed on the corresponding third frame 146e. In addition, each of the bodies 110a and 110b has a guiding structure 112, and the guiding structure 112 corresponds to the third frame 146e. In addition to being slidably disposed in the sliding groove 146b1 of the second frame 146b through the pin P as described above, the third frame 146e is also slidably disposed in a guiding groove 112a of the guiding structure 112 through the pin P. When the third frame 146e slides along the first direction D1 with the second frame 146b, the third frame 146e guided by the inclined section of the guiding groove 112a is driven to slide along the third direction D3 to drive the corresponding functional assemblies 130a and 130b to move up and down along the third direction D3 relative to the corresponding bodies 110a and 110b as shown in the operation flow of FIG. 3A to FIG. 3G or the operation flow of FIG. 4A to FIG. 4G. In other embodiments, by changing the extending mode of the guiding groove 112a, the timing for the functional assemblies 130a and 130b to move up and down may be changed accordingly, and the disclosure is not limited thereto.

Figure 11:
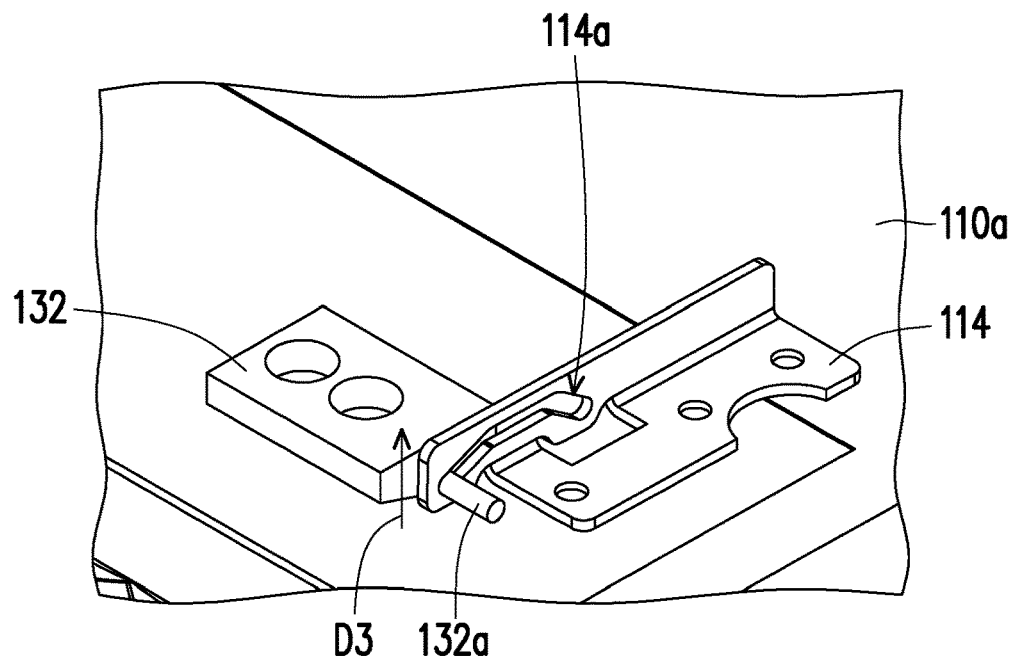
FIG. 11 illustrates how one end of the functional assembly of FIG. 2A is connected to the body.

FIG. 11 illustrates how one end of the functional assembly of FIG. 2A is connected to the body. FIG. 11 corresponds to the position 130a2 shown in FIG. 2A, and FIG. 8 corresponds to the position 130a1 shown in FIG. 2A. In the embodiment, one end of each of the functional assemblies 130a and 130b is fixed on the corresponding third frame 146e (shown in FIG. 8), and another end of each of the functional assemblies 130a and 130b is connected to the corresponding bodies 110a and 110b in a translational and vertically movable manner as shown in FIG. 11. Accordingly, each of the functional assemblies 130a and 130b in a collective manner is adapted to move up and down relative to the corresponding bodies 110a and 110b with the movement of the corresponding third frame 146e. In the embodiment, the body 110a may have a guiding structure 114 at the position 130a2 of FIG. 2A as shown in FIG. 11. The functional assembly 130a (not shown in FIG. 11) is slidably disposed in a guiding groove 114a of the guiding structure 114 through a pin 132a of a connecting element 132, so that one end of the functional assembly 130a guided by the inclined section of the guiding groove 114a is driven to move up and down along the third direction D3 as described above. In other embodiments, other guiding structures may be adapted to replace the guiding structure 114 of FIG. 11, so that the functional assembly 130a has a different operation mode, which is illustrated with reference to drawings below.

Figure 12:
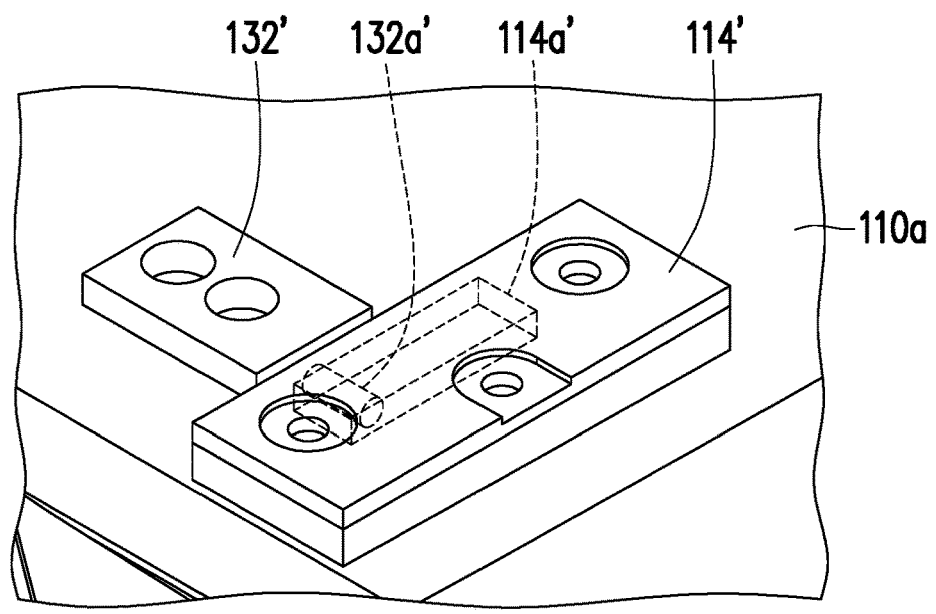
FIG. 12 illustrates how one end of the functional assembly is connected to the body according to another embodiment of the disclosure.

FIG. 12 illustrates how one end of the functional assembly is connected to the body according to another embodiment of the disclosure. The difference between the embodiment shown in FIG. 12 and the embodiment shown in FIG. 11 is that a guiding groove 114a' of the guiding structure 114' is a linear guiding groove without inclined sections, so that the one end of the functional assembly 130a (not shown in FIG. 12) may be connected to the body 110a in a transitional and rotatable manner through a pin 132a' of a connecting element 132', and in this way the functional assembly 130a in a collective manner is adapted to incline relative to the corresponding body 110a as the corresponding third frame 146e (shown in FIG. 8) moves up and down.

The disclosure does not limit the quantity of the linkage structure 140 and the relative position relationship between the linkage structure 140 and the hinge structure 120, which is illustrated with reference to drawings below.

Figure 13:
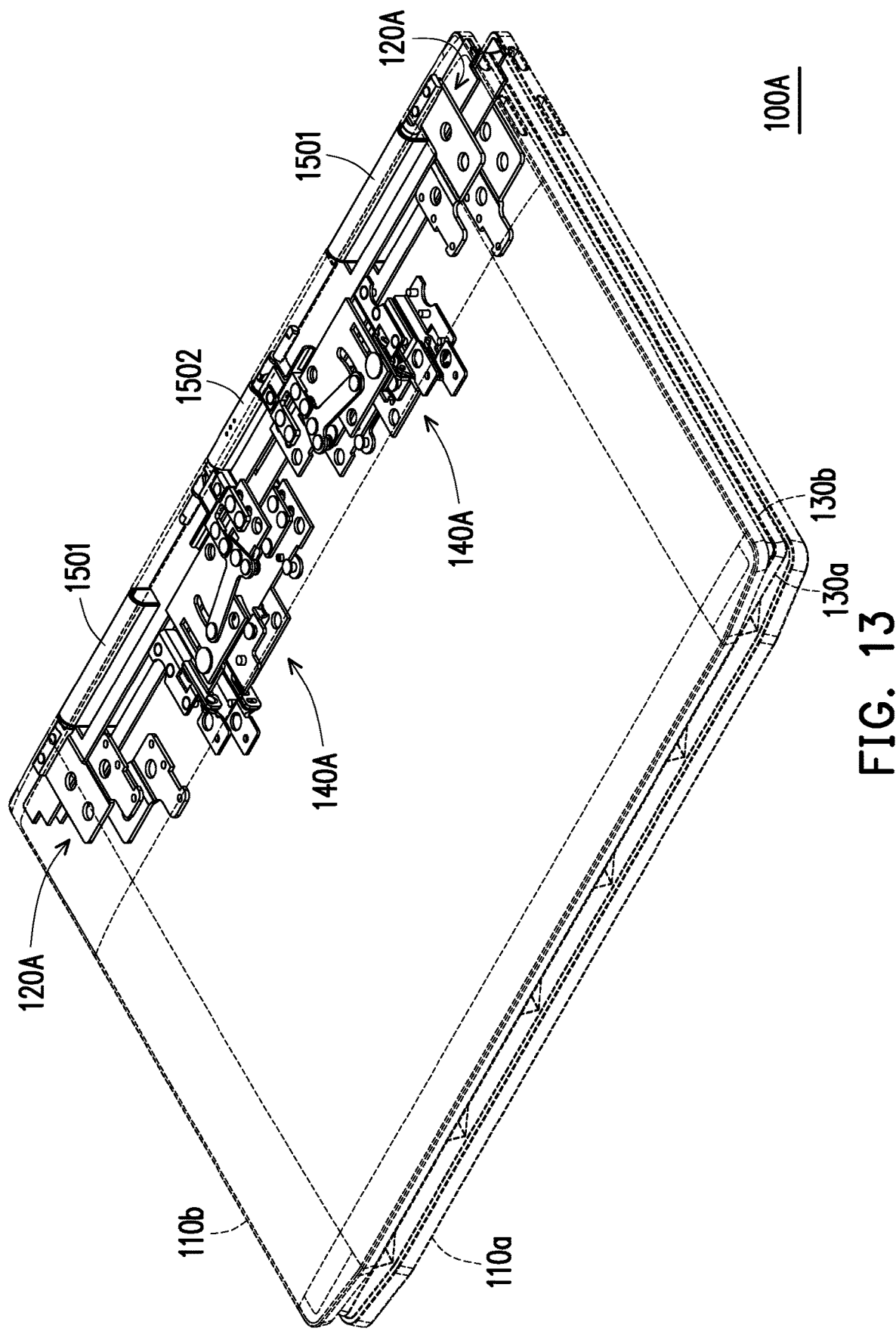
FIG. 13 is a perspective view of an electronic device according to another embodiment of the disclosure.
Figure 14:
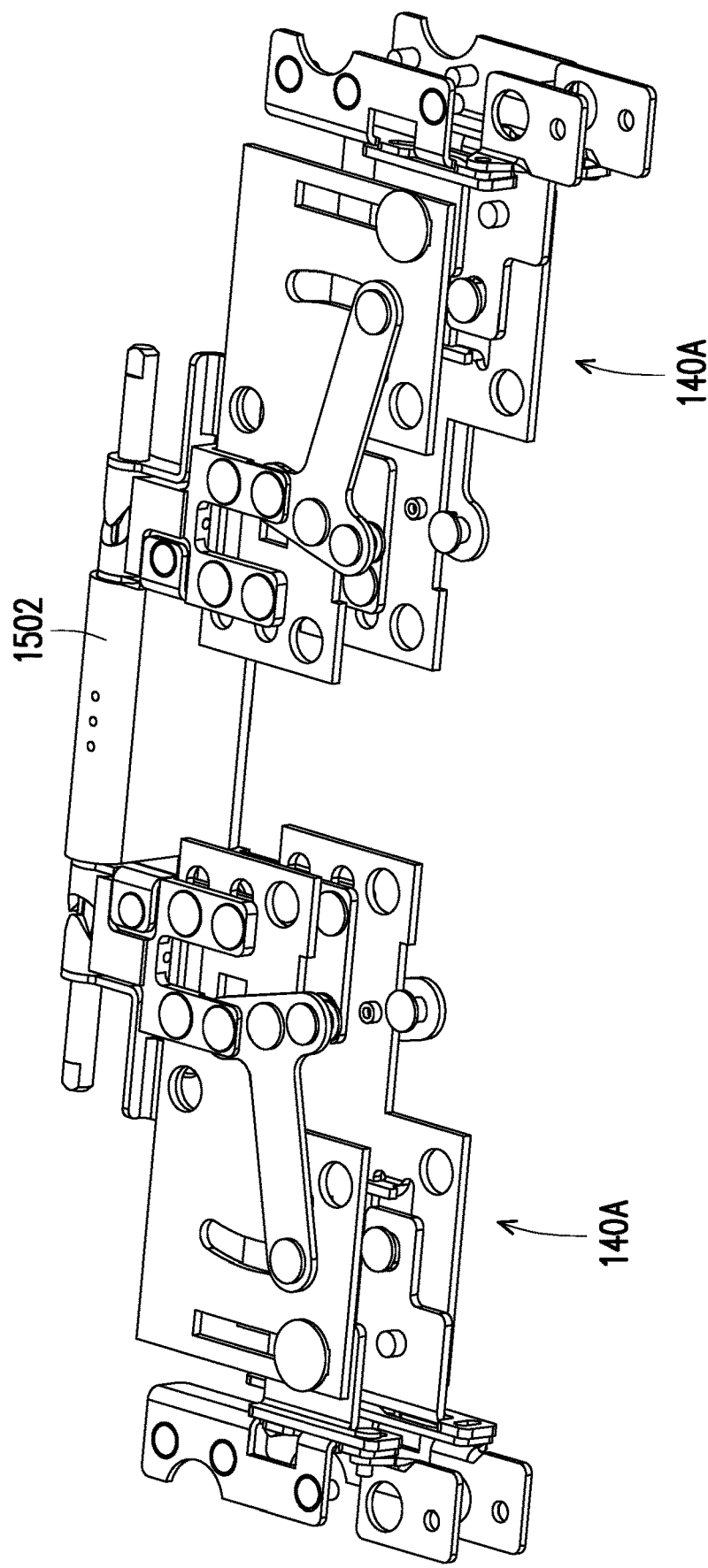
FIG. 14 is a perspective view of the linkage structure and the cover of FIG. 13.
Figure 15:
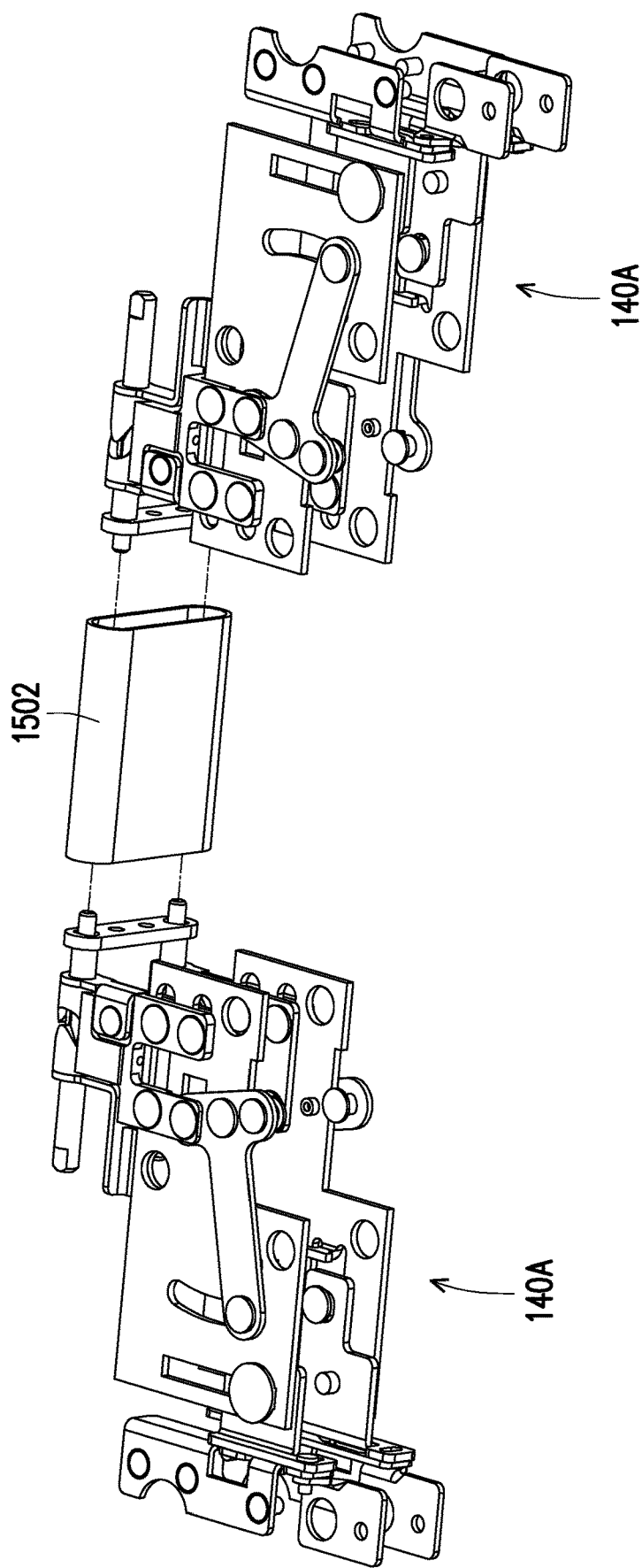
FIG. 15 is an exploded view of the linkage structure and the cover of FIG. 14.
Figure 16:
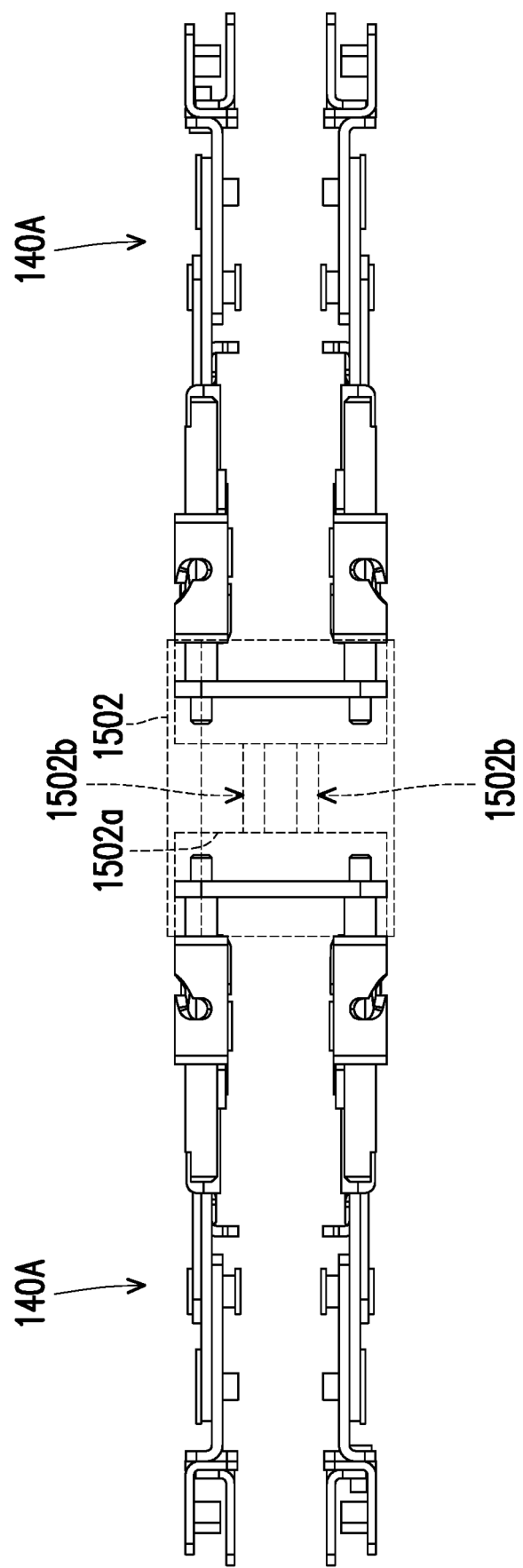
FIG. 16 is a rear view of the linkage structure and the cover of FIG. 14.

FIG. 13 is a perspective view of an electronic device according to another embodiment of the disclosure. FIG. 14 is a perspective view of the linkage structure and the cover of FIG. 13. FIG. 15 is an exploded view of the linkage structure and the cover of FIG. 14. The difference between the embodiment shown in FIG. 13 to FIG. 15 and the embodiment shown in FIG. 1 is that the electronic device 100A of FIG. 13 includes two covers 1501 and a cover 1502. The cover 1502 is disposed between two linkage structures 140A and covers part of each of the linkage structures 140A. The two covers 1501 respectively cover part of the two hinge structures 120A. FIG. 16 is a rear view of the linkage structure and the cover of FIG. 14. As shown in FIG. 16, the cover 1502 has a retaining wall 1502a separating the two linkage structures 140A, so that the two linkage structures 140A maintain a predetermined relative position after being assembled with the cover 1502. In addition, the cover 1502 may have a fastening hole 1502b in the retaining wall 1502a for the two linkage structures 140 to be fastened. The operation modes of the hinge structure 120A and the linkage structure 140A are the same or similar to those of the hinge structure 120 and the linkage structure 140 in the foregoing embodiment, and is not iterated here.

Figure 17:
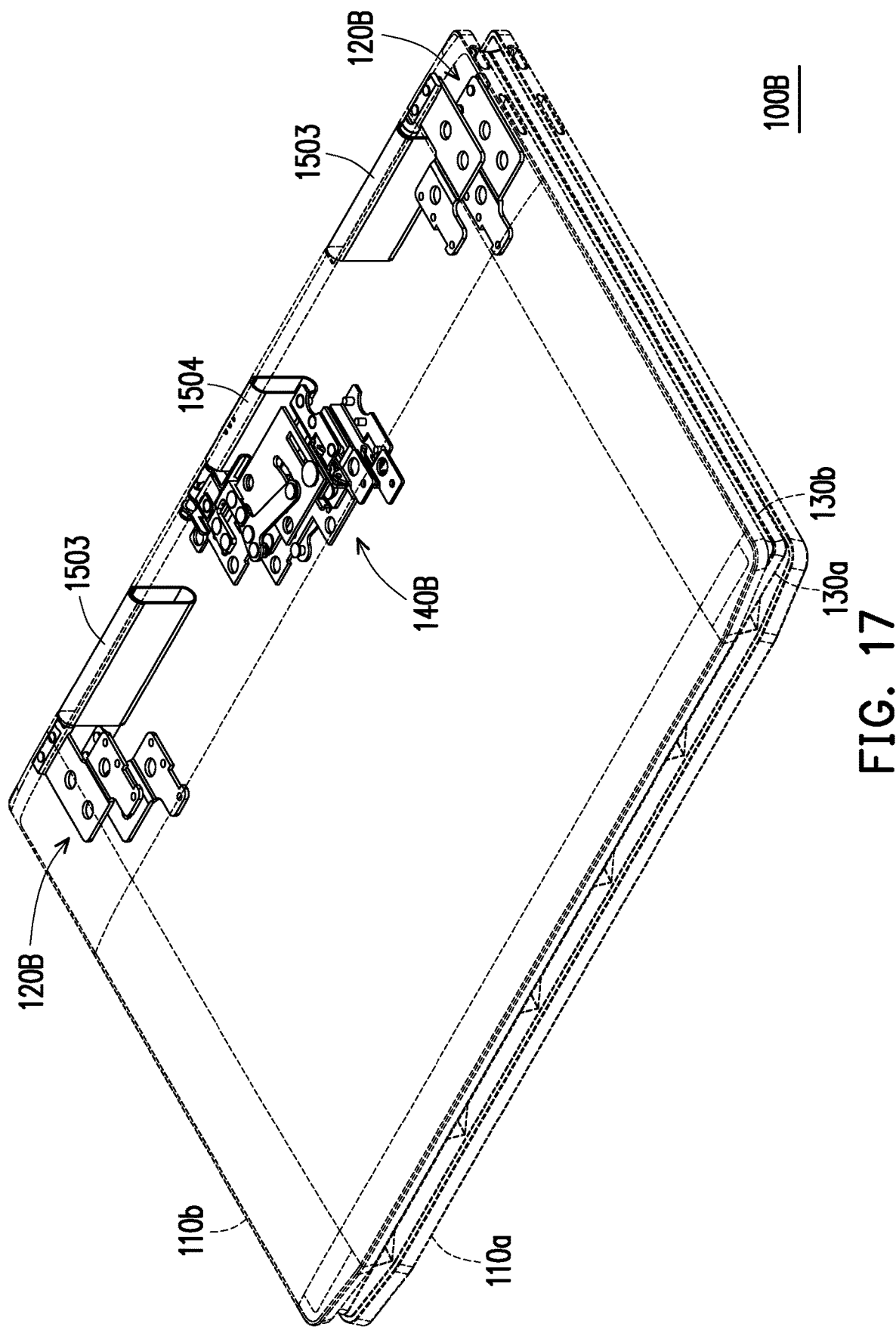
FIG. 17 is a perspective view of an electronic device according to another embodiment of the disclosure.

FIG. 17 is a perspective view of an electronic device according to another embodiment of the disclosure. The difference between the embodiment shown in FIG. 17 and the embodiment shown in FIG. 1 is that an electronic device 100B of FIG. 17 includes two covers 1503 and a cover 1504, and the cover 1503 covers part of two hinge structures 120B, respectively. The number of the linkage structure 140 is one and it is partially covered by the cover 1504. The operation modes of the hinge structure 120B and the linkage structure 140B are the same or similar to those of the hinge structure 120 and the linkage structure 140 in the foregoing embodiment, and is not iterated here.

Figure 18:
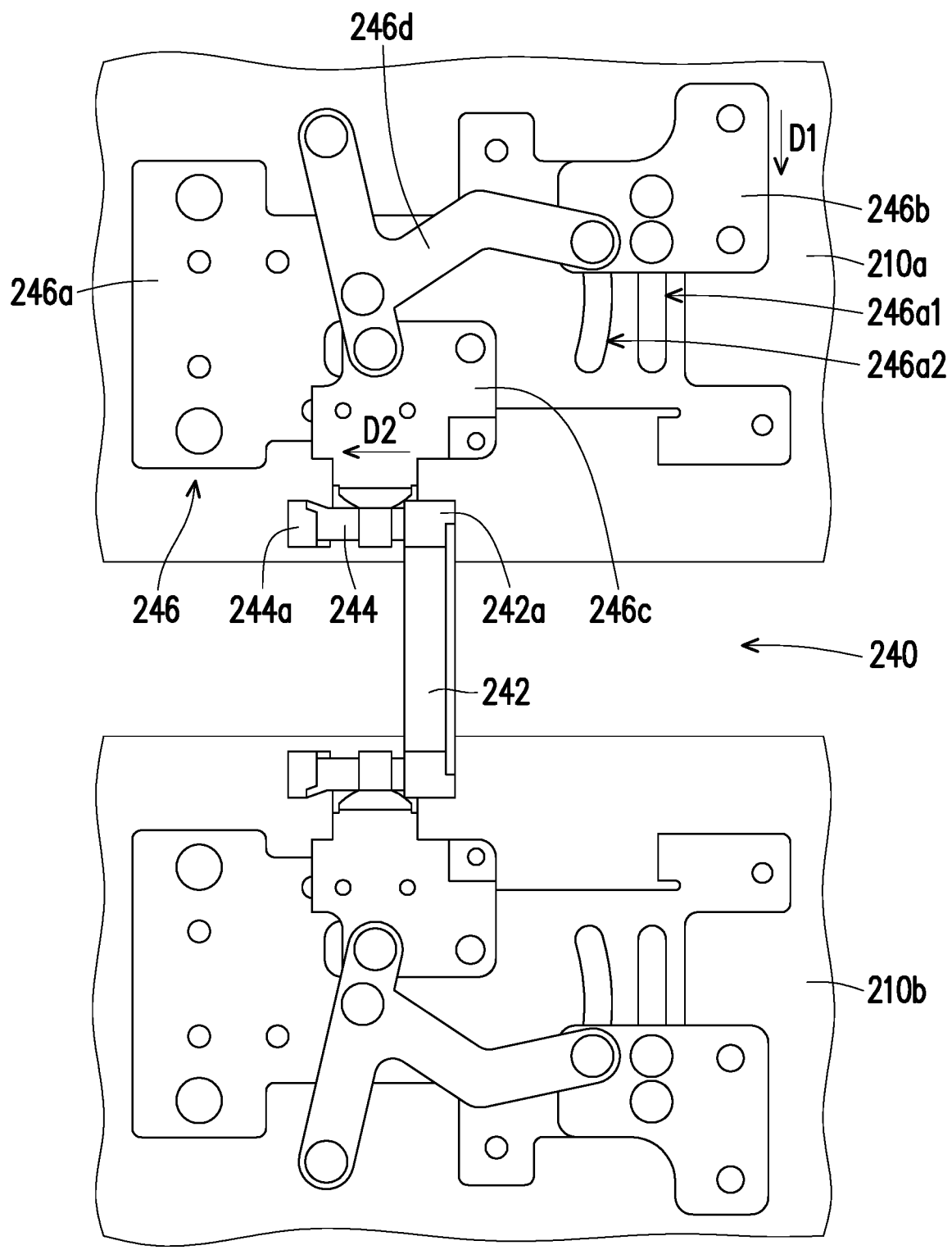
FIG. 18 is a schematic view of part of an electronic device according to another embodiment of the disclosure.
Figure 19:
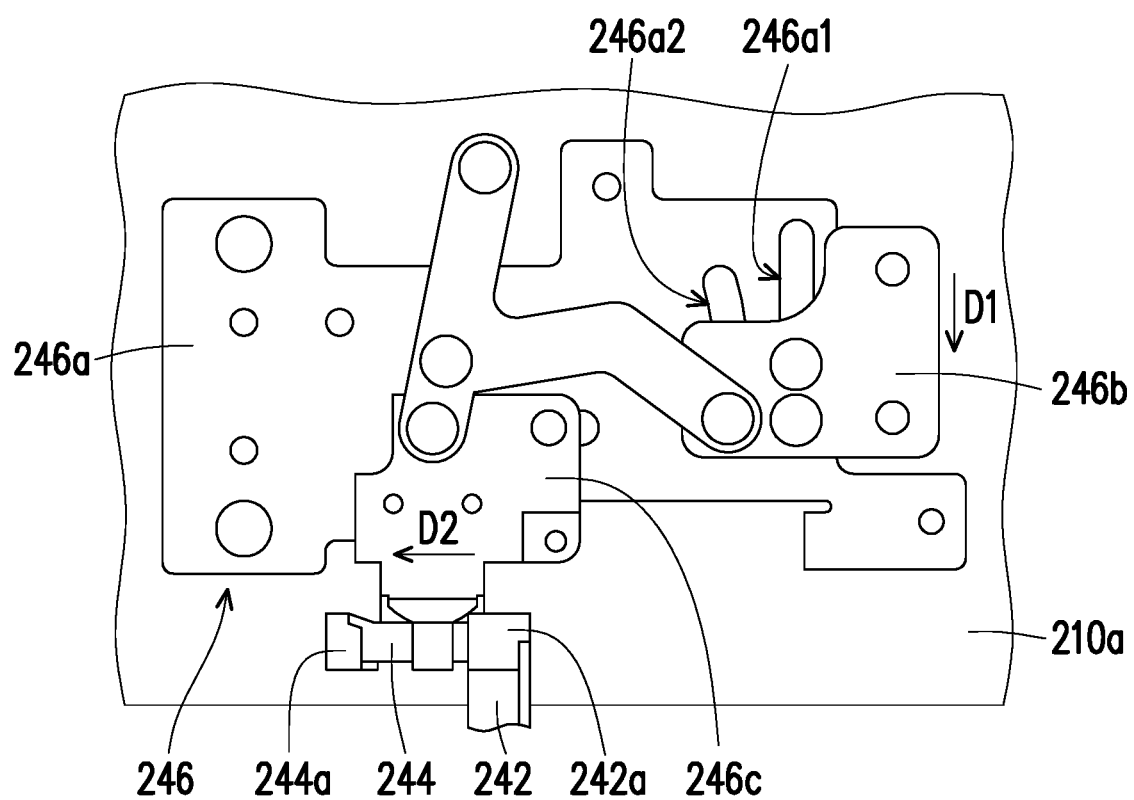
FIG. 19 illustrates the operation of the linkage structure of FIG. 18.

FIG. 18 is a perspective view of part of an electronic device according to another embodiment of the disclosure. FIG. 19 illustrates the operation of the linkage structure of FIG. 18. The main difference between the embodiment shown in FIG. 18 and FIG. 19 and the foregoing embodiment is that a linkage assembly 246 of FIG. 18 and FIG. 19 does not include a structure (e.g., the third frame 146e of the foregoing embodiment and the corresponding assemblies) to drive the functional assemblies to move up and down. The rest of the configuration and the operation mode of the linkage structure 240 shown in FIG. 18 and FIG. 19 are similar to the configuration and the operation mode of the linkage structure 140B of the foregoing embodiment, which is illustrated in detail below.

Referring to FIG. 18 and FIG. 19, the linkage structure 240 in the embodiment includes a first pivot assembly 242, two first shafts 244, and the two linkage assemblies 246. The two first shafts 244 are pivotally connected to the first pivot assembly 242 and are respectively connected to two bodies 210a and 210b and two functional assemblies (not shown but same as the functional assemblies 130a and 130b in the foregoing embodiment) through the two linkage assemblies 246. Specifically, each of the linkage assemblies 246 includes a first frame 246a and a second frame 246b. The first frame 246a is fixed on the corresponding bodies 210a and 210b and connected to the corresponding first shaft 244. The second frame 246b is slidably disposed in a sliding groove 246a1 of the first frame 246a along a first direction D1 perpendicular to the axial direction of the corresponding first shaft 244 and parallel to the display surface of the corresponding functional assembly and connected to the corresponding functional assemblies. The first pivot assembly 242 is adapted to drive the corresponding second frame 246b to slide relative to the corresponding first frame 246a along the first direction D1 between the position shown in FIG. 18 and the position shown in 19 as the two bodies 210a and 210b are rotated relative to each other, so that each of the second frames 246b drives the corresponding functional assembly to translate along the first direction D1 relative to the corresponding bodies 210a and 210b.

More specifically, each of the linkage assemblies 246 in the embodiment further includes a sliding element 246c and a connecting rod 246d. The sliding element 246c is slidably disposed on the first frame 246a along a second direction D2 perpendicular to the first direction D1 and parallel to the display surface of the corresponding functional assembly. The connecting rod 246d is connected between the sliding element 246c and the second frame 246b. The first pivot assembly 242 is adapted to drive the sliding element 246c to slide along the second direction D2 relative to the first frame 246a between the position shown in FIG. 18 and the position shown in FIG. 19, so that the sliding element 246c drives the second frame 246b to slide along the first direction D1 relative to the first frame 246a between the position shown in FIG. 18 and the position shown in FIG. 19 through the connecting rod 246d. In the embodiment, one end of the connecting rod 246d is pivotally connected to the sliding element 246c, and another end of the connecting rod 246d is slidably disposed in an arc-shaped groove 246a2 of the first frame 246a and is connected to the second frame 246b in a rotatable and movable manner, so that the sliding element 246c sliding along the second direction D2 is capable of driving the second frame 246b to slide along the first direction D1 through the connecting rod 246d. In other embodiments, the second frame 246b may be driven by other appropriate linkage assemblies, and the disclosure is not limited thereto.

Furthermore, the first pivot assembly 242 in the embodiment has two guiding parts 242a. The two guiding parts 242a respectively correspond to the two sliding elements 246c. As each of the linkage assemblies 246 is rotated relative to the first pivot assembly 242, the corresponding sliding element 246c is guided by the corresponding guiding part 242a to slide along the second direction D2 relative to the first frame 246a. In the embodiment, the guiding part 242a is, for example, a cam, driving the sliding element 246c to move along the second direction D2 as the sliding element 246c is rotated relative to the guiding part 242a. In addition, the first shaft 244 may also have a guiding part 244a. The guiding part 244a is, for example, a cam, driving the sliding element 246c to move along the second direction D2 as the sliding element 246c is rotated relative to the guiding part 244a.

Based on the above, in the electronic device of the disclosure, the linkage structure is not a structure included in the hinge structure, so the linkage structure can be independently disposed and apart from the hinge structure instead of being integrated into the hinge structure. Accordingly, when in operation, the hinge structure is not subjected to additional force caused by the configuration of the linkage structure, and the linkage structure disposed independently does not interfere with the structure and the operation of the hinge structure.

What is claimed is:

1. An electronic device, comprising:
   two bodies;
   at least one hinge structure, wherein the two bodies are pivotally connected to each other through the at least one hinge structure;
   a functional assembly movably disposed on one of the two bodies;
   at least one linkage structure connected between the two bodies, wherein the functional assembly is connected to the at least one linkage structure, and the at least one linkage structure is adapted to drive the functional assembly to move relative to a corresponding body of the two bodies as the two bodies are rotated relative to each other; and
   another functional assembly movably disposed on the other of the two bodies, wherein the another functional assembly is connected to the at least one linkage structure, and the at least one linkage structure is adapted to drive the another functional assembly to move relative to the corresponding other body as the two bodies are rotated relative to each other,
   wherein the at least one hinge structure and the functional assembly are structurally independent from each other,
   wherein the at least one linkage structure comprises a first pivot assembly, two first shafts, and two linkage assemblies; and the two linkage assemblies are respectively pivotally connected to the first pivot assembly through the two first shafts and respectively connected to the two bodies and the two functional assemblies.

2. The electronic device according to claim 1, wherein each of the linkage assemblies comprises a first frame and a second frame; the first frame is fixed on the corresponding body and connected to the corresponding first shaft; the second frame is slidably disposed on the first frame along a first direction perpendicular to an axial direction of the corresponding first shaft and parallel to the corresponding display surface of the functional assembly, and connected to the corresponding functional assembly; and the first pivot assembly is adapted to drive the corresponding second frame to slide along the first direction relative to the corresponding first frame body as the two bodies are rotated relative to each other, so that each of the corresponding functional assemblies driven by the second frame relative to the corresponding body is translated along the first direction.

3. The electronic device according to claim 2, wherein each of the linkage assemblies further comprises a sliding element and a connecting rod; the sliding element is slidably disposed on the first frame along a second direction perpendicular to the first direction and parallel to the corresponding display surface of the functional assembly; the connecting rod is connected between the sliding element and the second frame; and the first pivot assembly is adapted to drive the sliding element to slide relative to the first frame along the second direction, so that the sliding element drives the second frame to slide relative to the first frame along the first direction through the connecting rod.

4. The electronic device according to claim 3, wherein the first pivot assembly or the two first shafts comprise two guiding parts, and the two guiding parts respectively correspond to the two sliding elements, wherein as each of the linkage assemblies is rotated relative to the first pivot assembly, the corresponding sliding element is guided by the corresponding guiding part to slide relative to the first frame along the second direction.

5. The electronic device according to claim 2, wherein each of the linkage assemblies further comprises a third frame, the third frame is slidably disposed on the second frame along a third direction perpendicular to the first direction and perpendicular to the display surface of the corresponding functional assembly, each of the functional assemblies is fixed on the corresponding third frame, and when the third frame slides along the first direction with the second frame, the third frame is driven to slide along the third direction to drive the corresponding functional assembly relative to the corresponding body to move up and down along the third direction.

6. The electronic device according to claim 5, wherein each of the bodies comprises a guiding structure corresponding to the third frame, and when the third frame slides along the first direction with the second frame, the third frame is guided by the guiding structure to slide along the third direction.

7. The electronic device according to claim 5, wherein one end of each of the functional assemblies is fixed on the corresponding third frame, and another end of each of the functional assemblies is connected to the corresponding body in a translational and vertically movable manner, so that each of the functional assemblies in a collective manner is adapted to move up and down relative to the corresponding body as the corresponding third frame moves.

8. The electronic device according to claim 5, wherein one end of each of the functional assemblies is fixed on the corresponding third frame, and another end of each of the functional assemblies is connected to the corresponding body in a translational and movable manner, so that each of the functional assemblies in a collective manner is adapted to incline relative to the corresponding body as the corresponding third frame moves.

9. The electronic device according to claim 1, wherein when the two bodies are unfolded relative to each other from a closed state to a state with a first unfolding angle, the at least one linkage structure does not drive each of the functional assemblies to move relative to the corresponding body; when the two bodies with the first unfolding angle continue to be unfolded relative to each other to a state with a second unfolding angle, the at least one linkage structure drives each of the functional assemblies to move up and translate relative to the corresponding body so that edges of the two functional assemblies are close to each other; when the two bodies with the second unfolding angle continue to be unfolded relative to each other to a state with a third unfolding angle, the at least one linkage structure drives each of the functional assemblies to translate relative to the corresponding body so that the edges of the two functional assemblies are close to each other; when the two bodies with the third unfolding angle continue to be unfolded relative to each other to a state with a fourth unfolding angle, the at least one linkage structure drives each of the functional assemblies to move down and translate relative to the corresponding body so that the edges of the two functional assemblies lean against each other; when the two bodies with the fourth unfolding angle continue to be unfolded relative to each other to a state with a fifth unfolding angle, the at least one linkage structure drives each of the functional assemblies to translate relative to the corresponding body so that the edges of the two functional assemblies are apart from each other; and when the two bodies with the fifth unfolding angle continue to be unfolded relative to each other to a state with a sixth unfolding angle, the at least one linkage structure does not drive each of the functional assemblies to move relative to the corresponding body.

10. The electronic device according to claim 1, wherein when the two bodies are unfolded relative to each other from a closed state to a state with a first unfolding angle, the at least one linkage structure does not drive each of the functional assemblies to move relative to the corresponding body; when the two bodies with the first unfolding angle continue to be unfolded relative to each other to a state with a second unfolding angle, the at least one linkage structure drives each of the functional assemblies to move up and translate relative to the corresponding body so that edges of the two functional assemblies are close to each other; when the two bodies with the second unfolding angle continue to be unfolded relative to each other to a state with a third unfolding angle, the at least one linkage structure drives each of the functional assemblies to translate relative to the corresponding body so that the edges of the two functional assemblies are close to each other; when the two bodies with the third unfolding angle continue to be unfolded relative to each other to a state with a fourth unfolding angle, the at least one linkage structure drives each of the functional assemblies to translate relative to the corresponding body so that the edges of the two functional assemblies lean against each other; when the two bodies with the fourth unfolding angle continue to be unfolded relative to each other to a state with a fifth unfolding angle, the at least one linkage structure drives each of the functional assemblies to move down and translate relative to the corresponding body so that the edges of the two functional assemblies are apart from each other;

and when the two bodies with the fifth unfolding angle continue to be unfolded relative to each other to a state with a sixth unfolding angle, the at least one linkage structure does not drive each of the functional assemblies to move relative to the corresponding body.

11. The electronic device according to claim 1, further comprising at least one cover, wherein the at least one cover is disposed between the at least one hinge structure and the at least one linkage structure and covers part of the at least one hinge structure and part of the at least one linkage structure.

12. The electronic device according to claim 11, wherein the at least one cover comprises a retaining wall, and the retaining wall separates the at least one hinge structure and the at least one linkage structure.

13. The electronic device according to claim 1, further comprising a cover, wherein a number of the at least one linkage structure is two, and the cover is disposed between the two linkage structures and covers part of each of the linkage structures.

14. The electronic device according to claim 13, wherein the cover has a retaining wall, and the retaining wall separates the two linkage structures.

15. The electronic device according to claim 1, wherein the at least one linkage structure comprises a first pivot assembly and two first shafts, the two bodies are respectively pivotally connected to the first pivot assembly through the two first shafts, the at least one hinge structure comprises a second pivot assembly and two second shafts, the two second shafts are pivotally connected to the second pivot assembly and respectively connected to the two bodies, and the two first shafts are separated from the two second shafts.

* * * * *